(12) United States Patent
Stettner et al.

(10) Patent No.: US 9,453,914 B2
(45) Date of Patent: Sep. 27, 2016

(54) TERRAIN MAPPING LADAR SYSTEM

(75) Inventors: Roger Stettner, Santa Barbara, CA (US); Howard Bailey, Santa Barbara, CA (US); Brad Short, Goleta, CA (US); Laurent Heughebaert, Santa Paula, CA (US); Patrick Gilliland, Santa Barbara, CA (US); Joseph Spagnolia, Ventura, CA (US); Bart Goldstein, Santa Barbara, CA (US)

(73) Assignee: CONTINENTAL ADVANCED LIDAR SOLUTIONS US, INC., Carpinteria, CA (US)

( * ) Notice: Subject to any disclaimer, the term of this patent is extended or adjusted under 35 U.S.C. 154(b) by 1005 days.

(21) Appl. No.: 13/608,007

(22) Filed: Sep. 10, 2012

(65) Prior Publication Data

US 2015/0301180 A1 Oct. 22, 2015

Related U.S. Application Data

(60) Provisional application No. 61/532,371, filed on Sep. 9, 2011.

(51) Int. Cl.

| G01C 3/08 | (2006.01) |
|---|---|
| G01S 17/89 | (2006.01) |
| G01S 17/10 | (2006.01) |
| G01S 7/481 | (2006.01) |
| G01S 7/486 | (2006.01) |
| G01S 7/487 | (2006.01) |
| H01L 27/146 | (2006.01) |

(52) U.S. Cl.
CPC .............. *G01S 17/89* (2013.01); *G01S 7/487* (2013.01); *G01S 7/4813* (2013.01); *G01S 7/4818* (2013.01); *G01S 7/4863* (2013.01); *G01S 7/4865* (2013.01); *G01S 17/107* (2013.01); *H01L 27/14609* (2013.01); *H01L 27/14694* (2013.01)

(58) Field of Classification Search
CPC ............................... G01C 3/08; G01S 15/002
See application file for complete search history.

(56) References Cited

U.S. PATENT DOCUMENTS

| 5,016,085 | A  | * | 5/1991 | Hubbard | ................ | H01L 23/13 257/700 |
|---|---|---|---|---|---|---|
| 6,444,968 | B1 | * | 9/2002 | Burt | .................. | H01L 27/14806 250/208.1 |
| 7,130,028 | B2 | * | 10/2006 | Pain | ..................... | H04N 3/1575 348/E3.022 |
| 2003/0025518 | A1 | * | 2/2003 | Berkely | ............... | G01R 31/046 324/762.01 |
| 2004/0036851 | A1 | * | 2/2004 | Hunter | ...................... | G01P 3/68 356/5.01 |
| 2005/0058173 | A1 | * | 3/2005 | Vetrovec | ................. | H01S 3/025 372/66 |
| 2007/0075825 | A1 | * | 4/2007 | Kato | ...................... | H01C 13/02 338/195 |
| 2007/0103679 | A1 | * | 5/2007 | Yoo | ............................ | G01J 3/02 356/301 |
| 2009/0173883 | A1 | * | 7/2009 | Kauffman | ......... | H01L 27/14649 250/338.4 |
| 2009/0295492 | A1 | * | 12/2009 | Finocchiaro | ............. | H03H 5/12 331/117 R |
| 2010/0008588 | A1 | * | 1/2010 | Feldkhun | ........... | G01B 11/2518 382/206 |
| 2010/0141503 | A1 | * | 6/2010 | Baumatz | ................... | G01S 7/48 342/27 |
| 2012/0120230 | A1 | * | 5/2012 | Wilkerson | ............. | G01W 1/08 348/135 |
| 2012/0182541 | A1 | * | 7/2012 | Canham | ................... | G01C 3/08 356/5.01 |

* cited by examiner

*Primary Examiner* — Luke Ratcliffe
*Assistant Examiner* — Samantha K Abraham

(57) ABSTRACT

A lightweight, low volume, high performance LADAR sensor incorporating 3-D focal plane arrays is adapted specifically for terrain mapping. The present invention generates, at high speed, 3-D topographical, water surface, floating object, bathymetric, biological gas cloud, poison gas cloud, or smoke stack emission mapping data. The 3-D focal planes are used in a variety of physical configurations which provide advantages over prior art terrain mapping LADAR sensors.

30 Claims, 18 Drawing Sheets

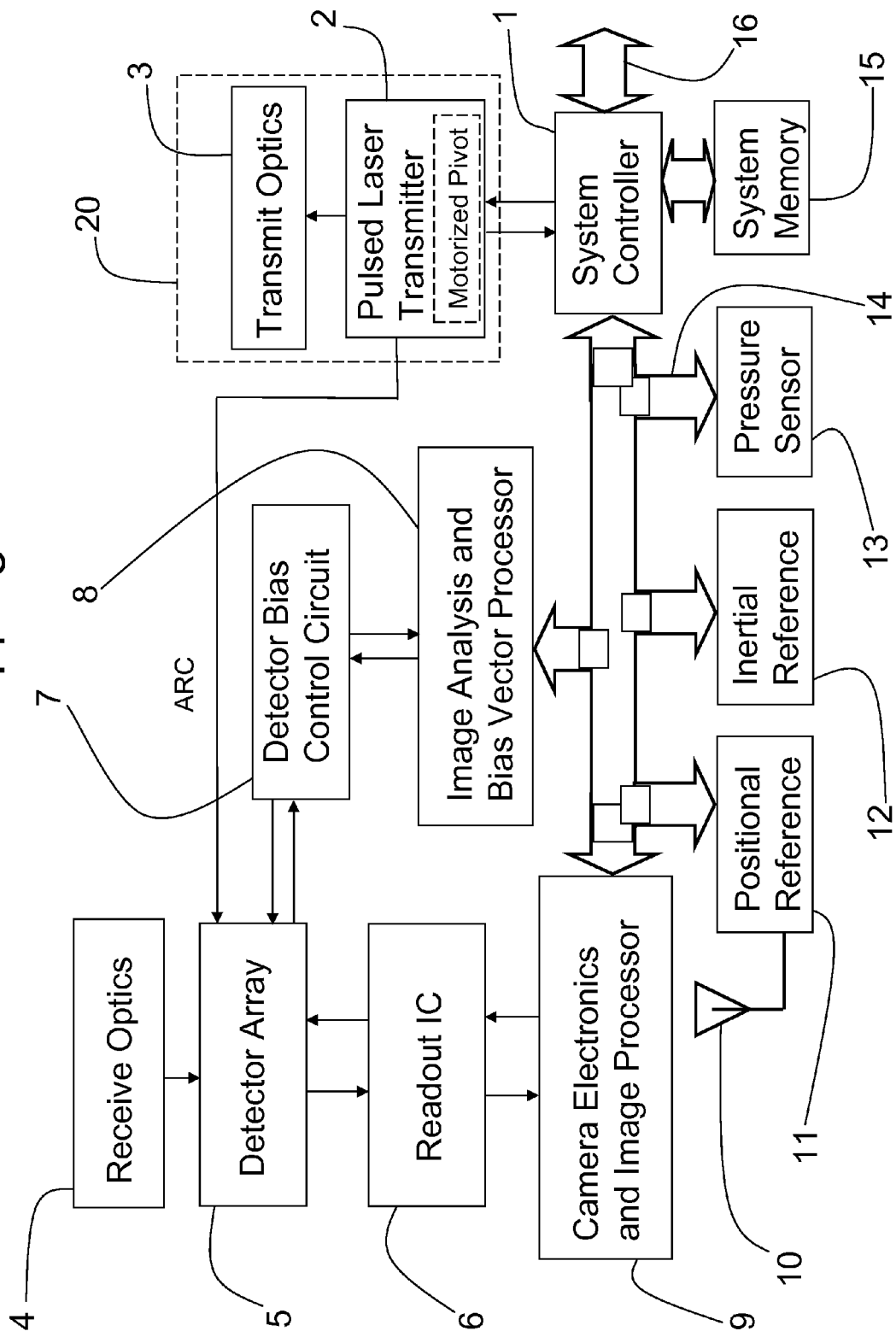
FIGURE 1. Terrain Mapping LADAR Sensor

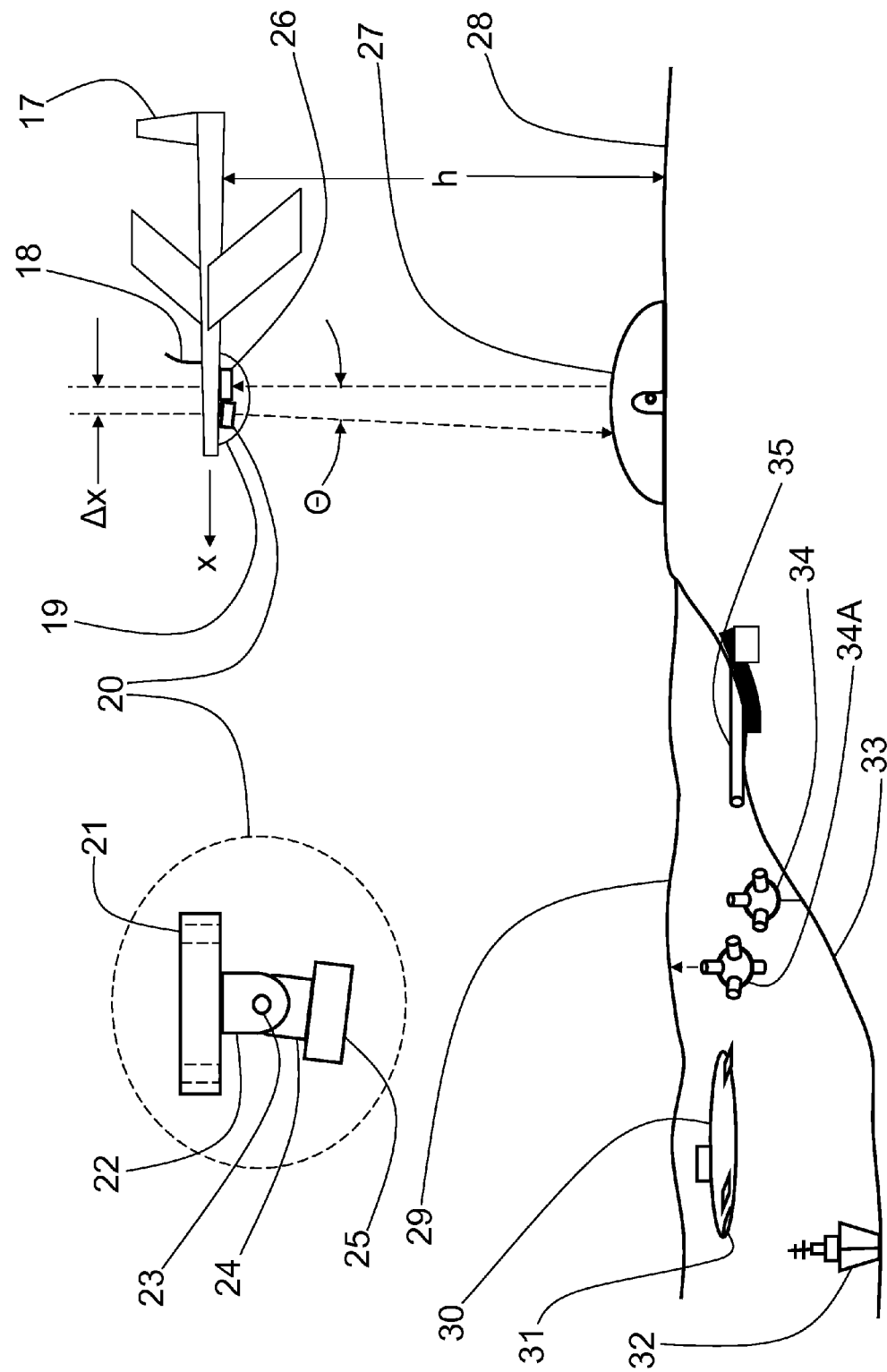
FIGURE 2. UAV Terrain Mapping LADAR

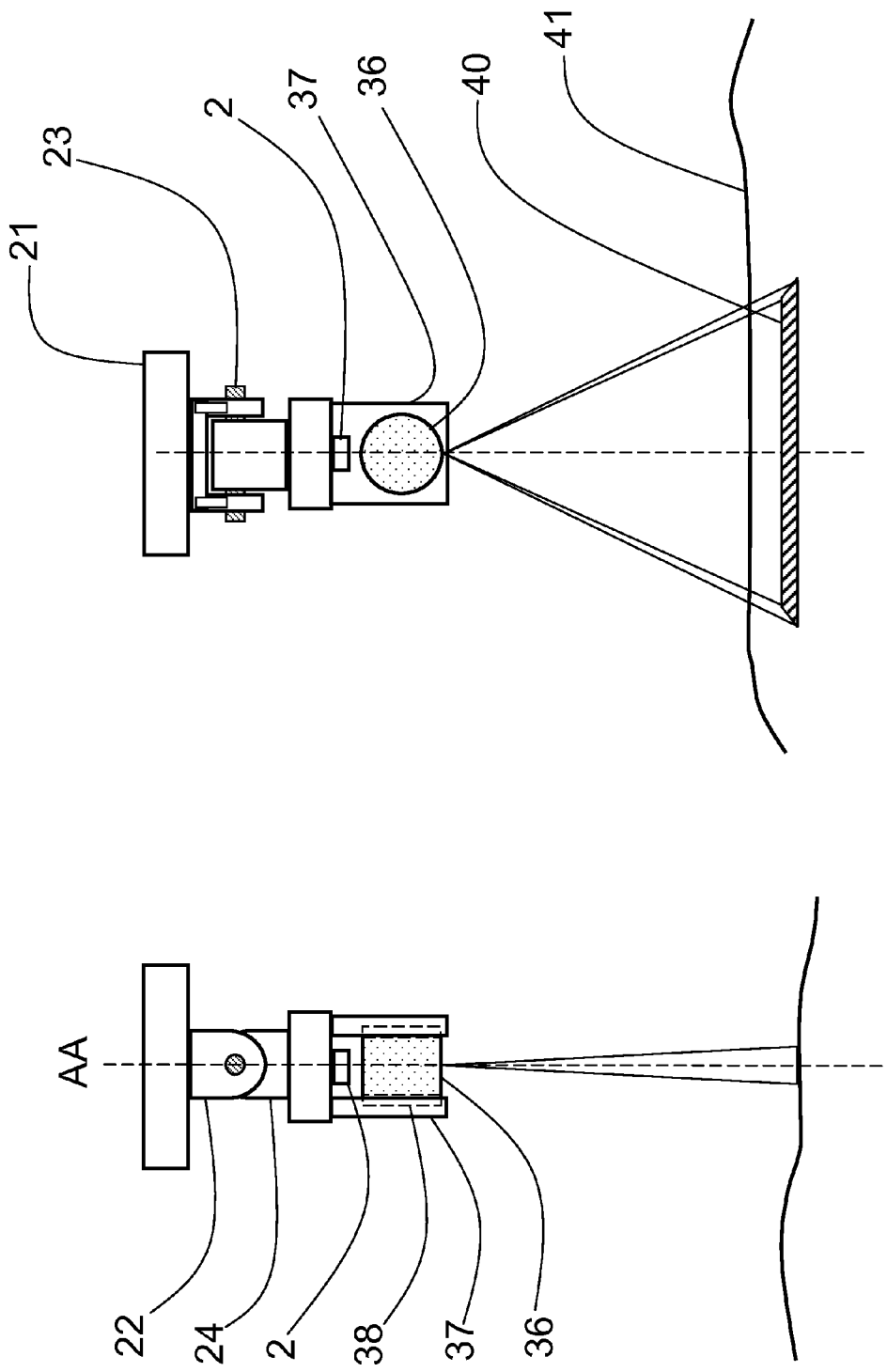
FIGURE 3. Pulsed Laser Transmitter on Motorized Pivot

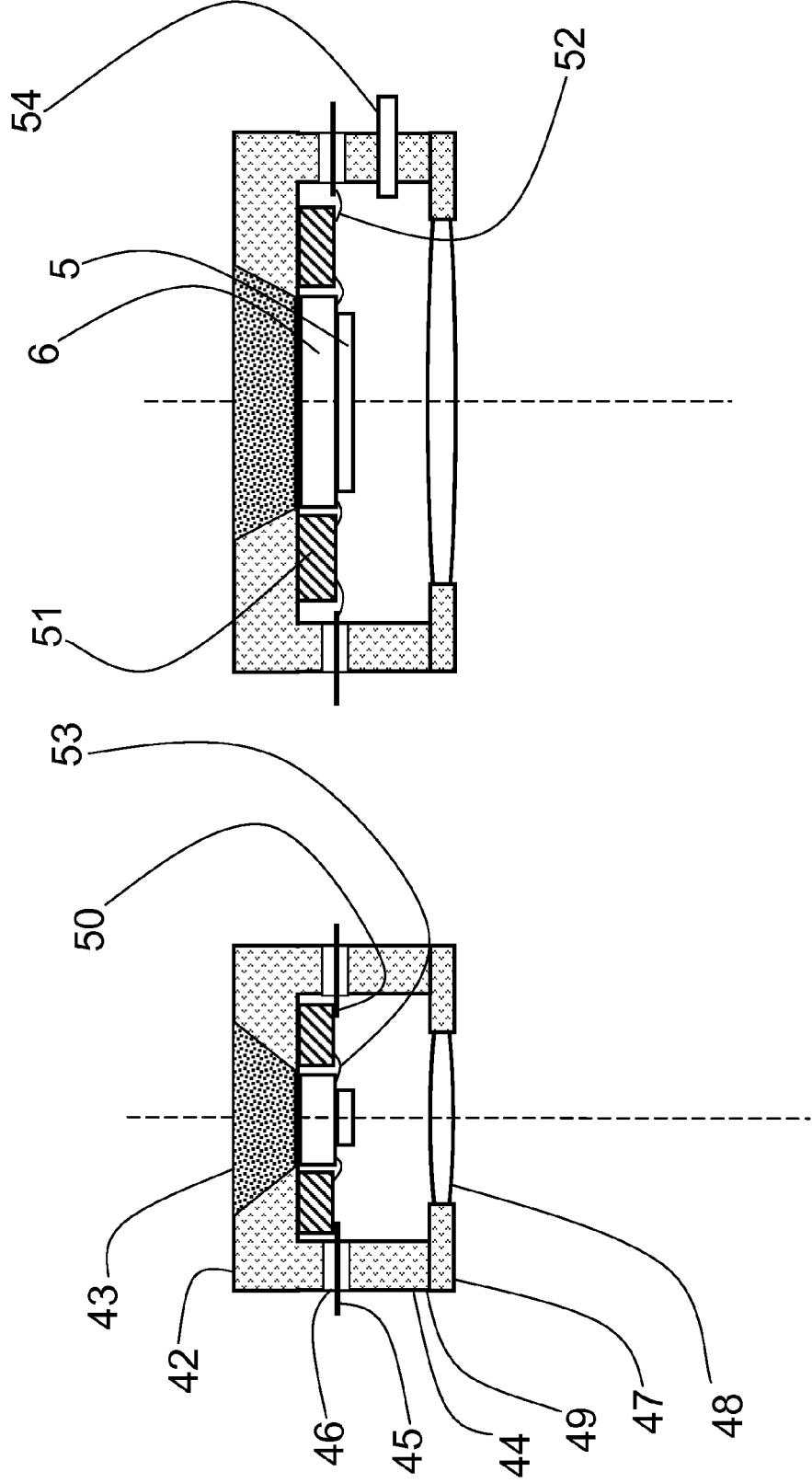
FIGURE 4. Optical Receiver Hybrid

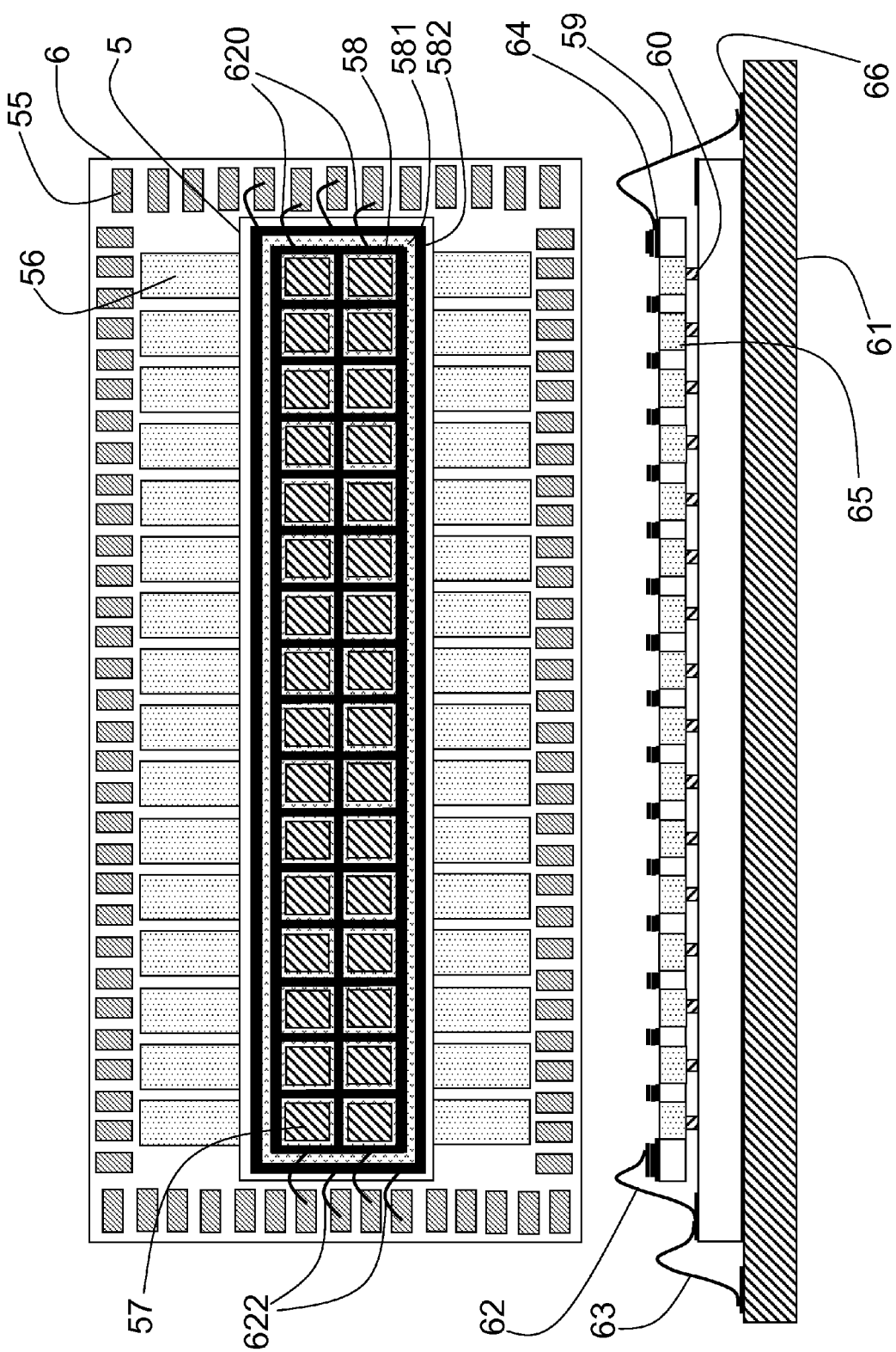
FIGURE 5. Detector Hybrid Geometry

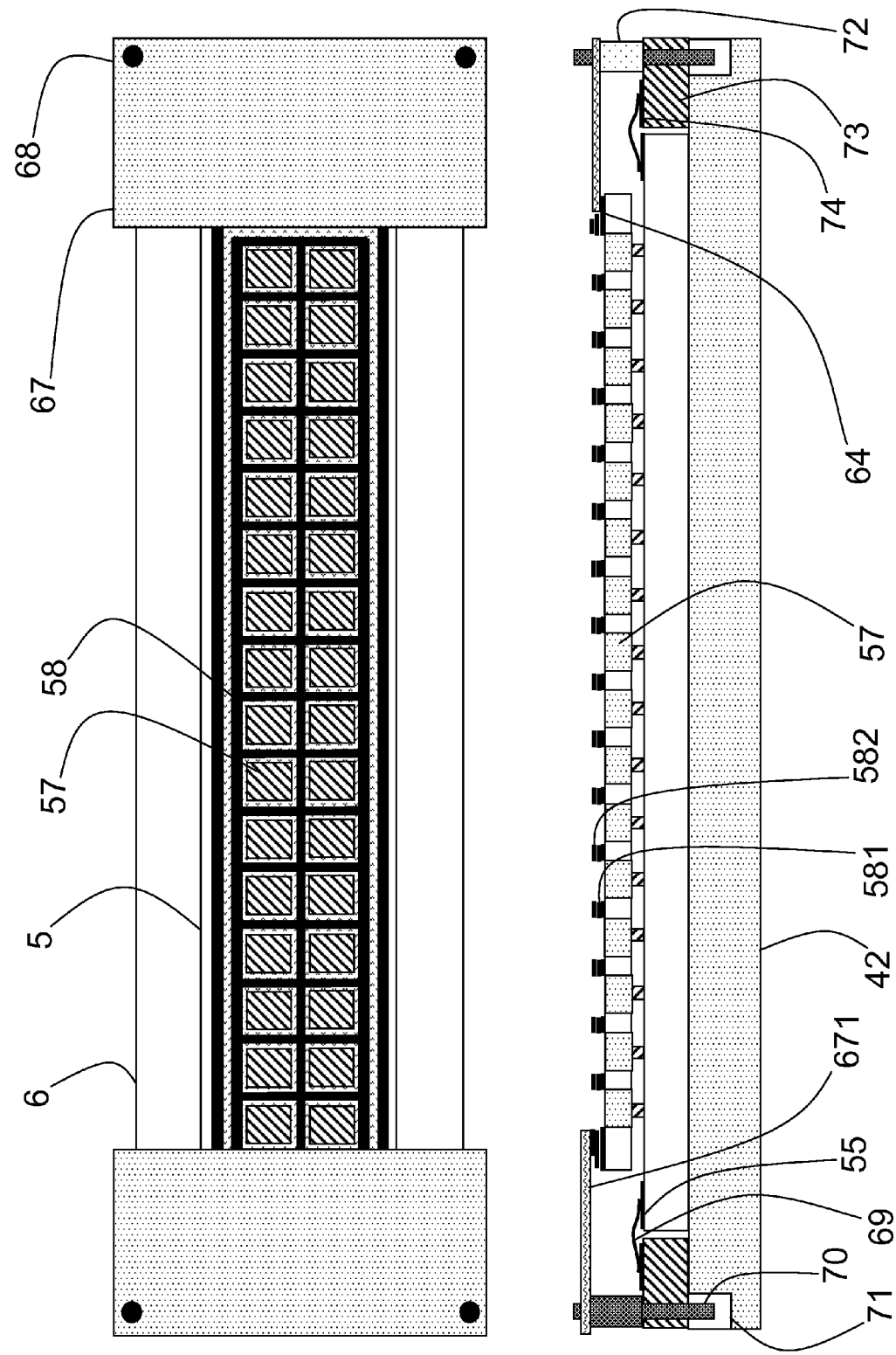
FIGURE 6. Detector Hybrid Mounting

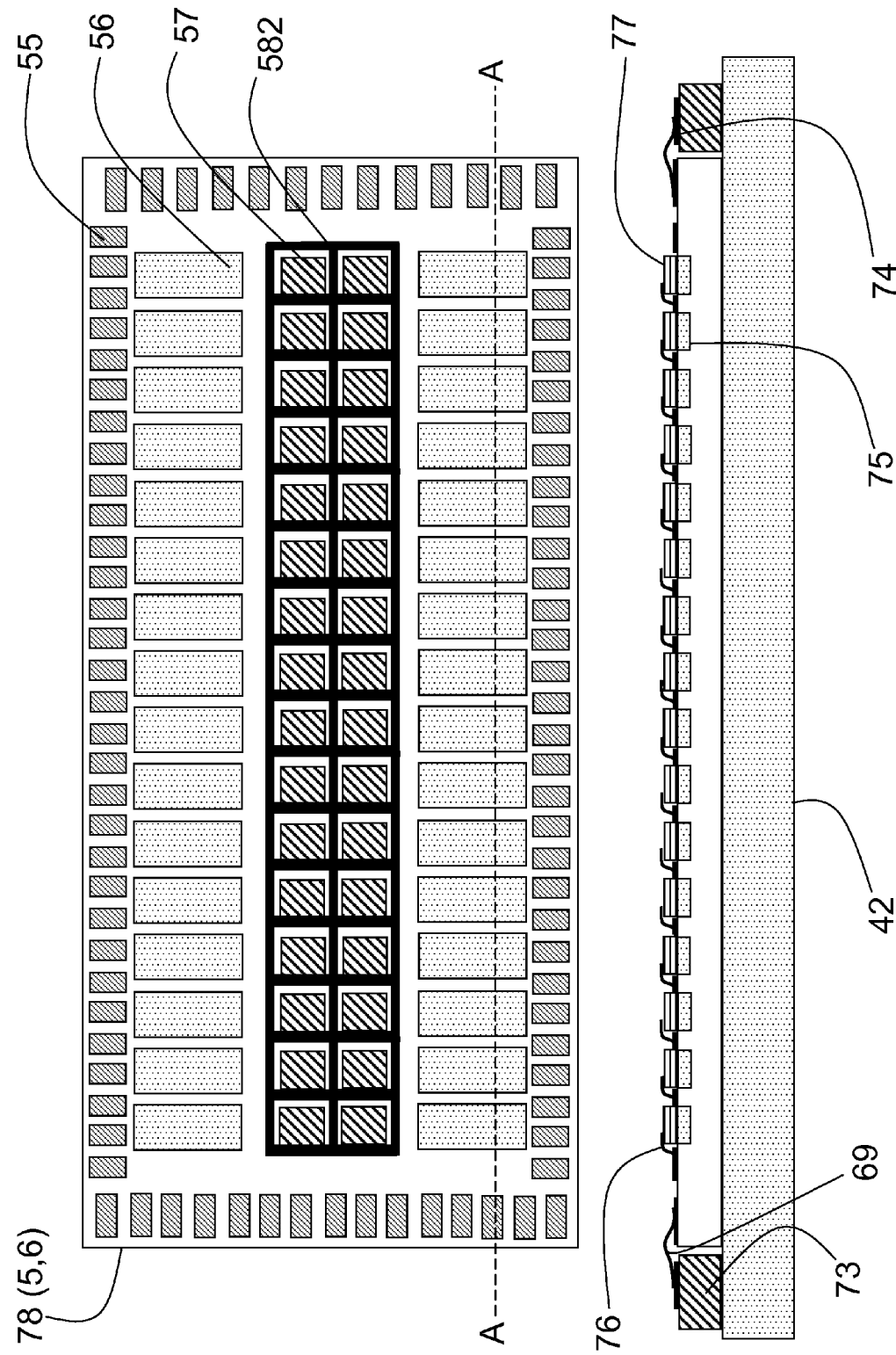
FIGURE 7. Integrated Detector Array/Readout Circuit

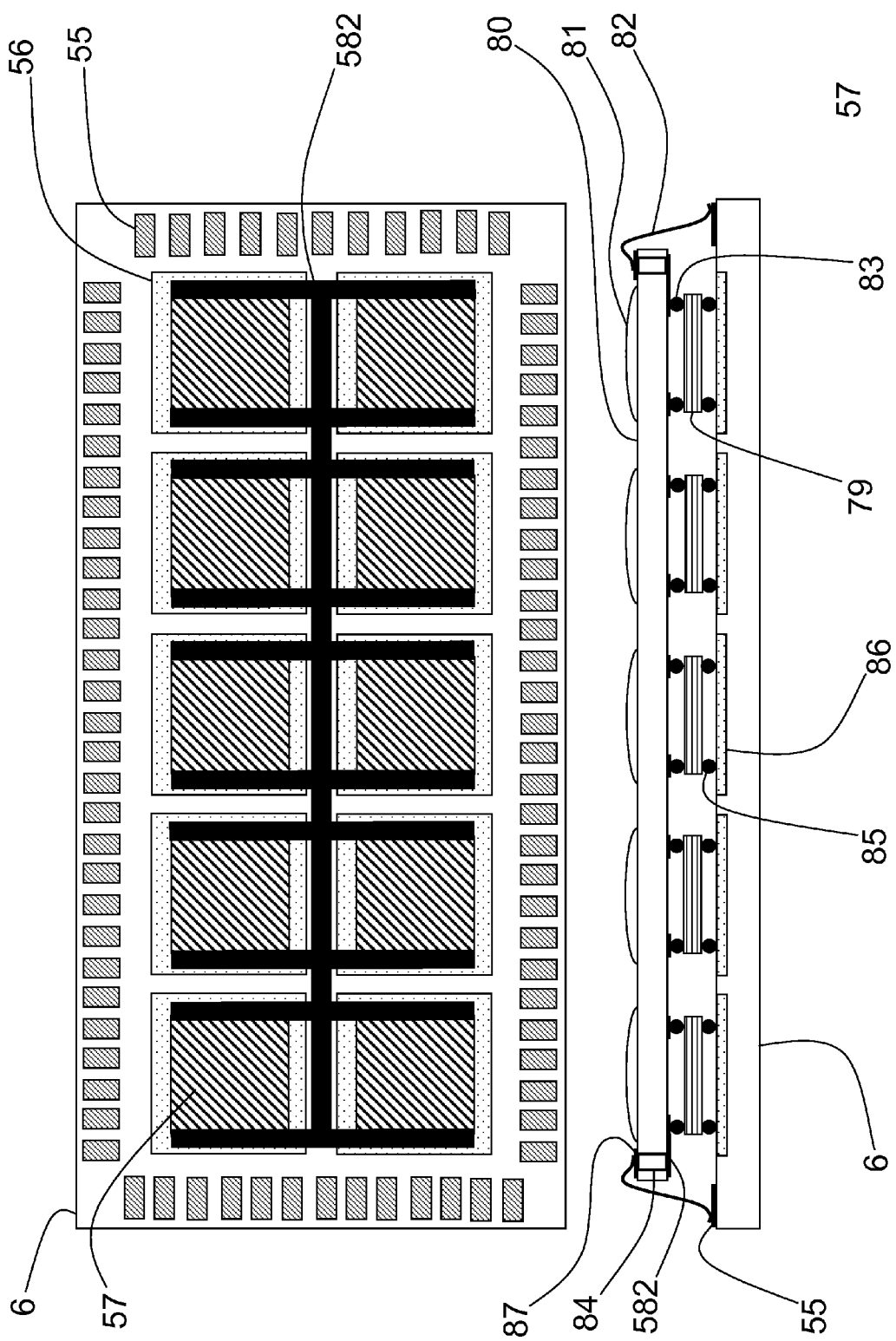
FIGURE 8. Discrete Focal Plane Array

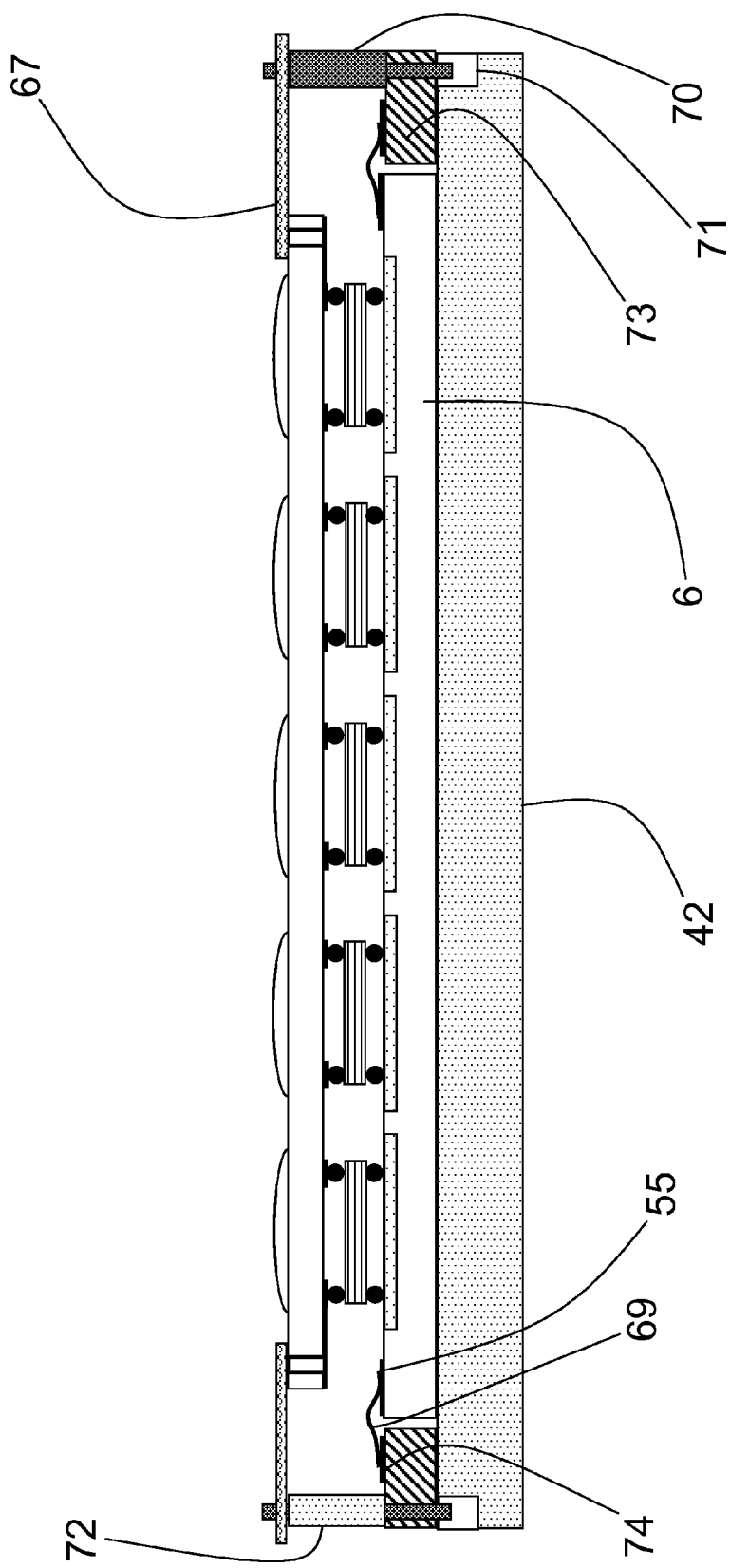
FIGURE 9. DFPA Circuit Assembly

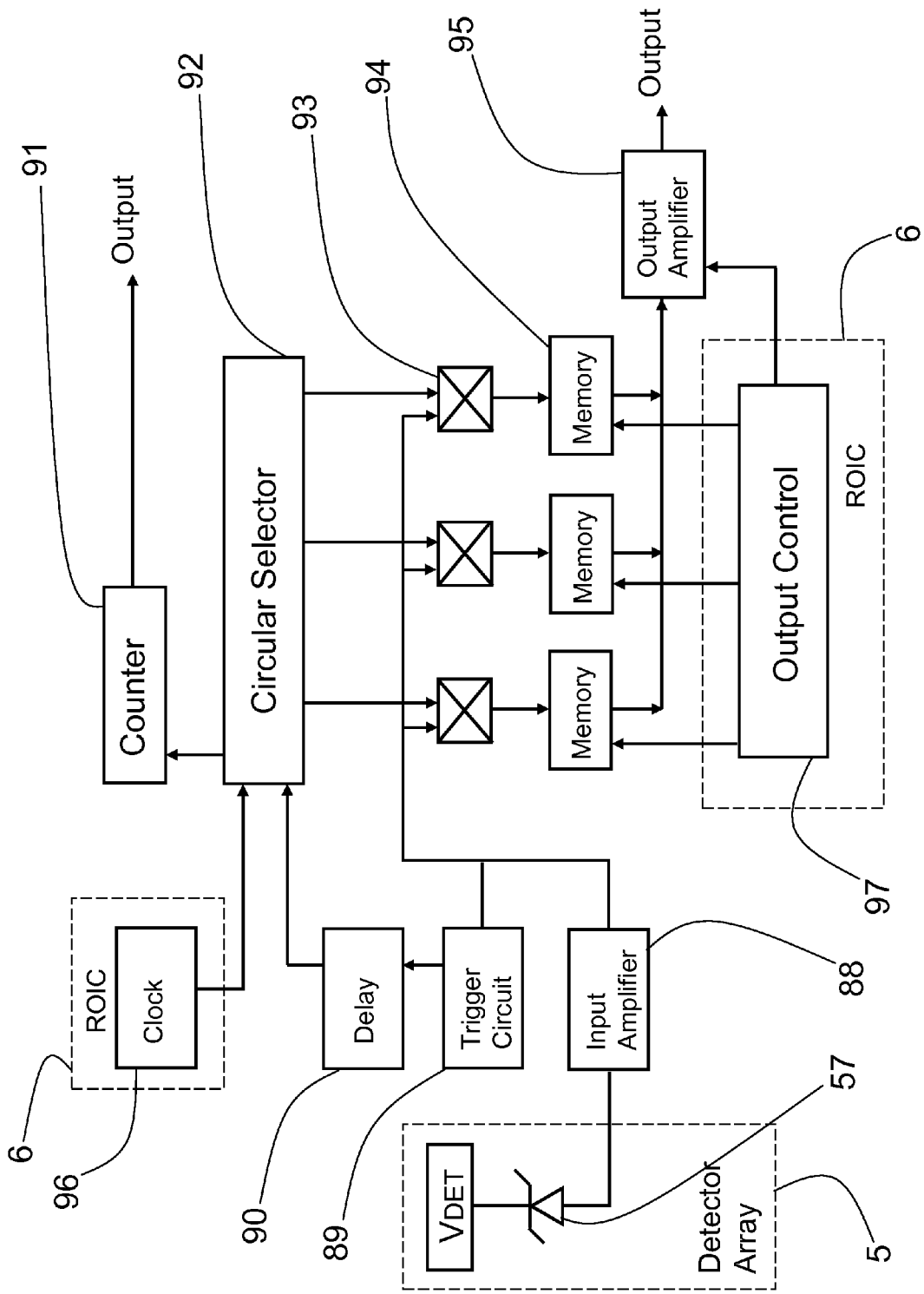
FIGURE 10. Unit Cell Electronics

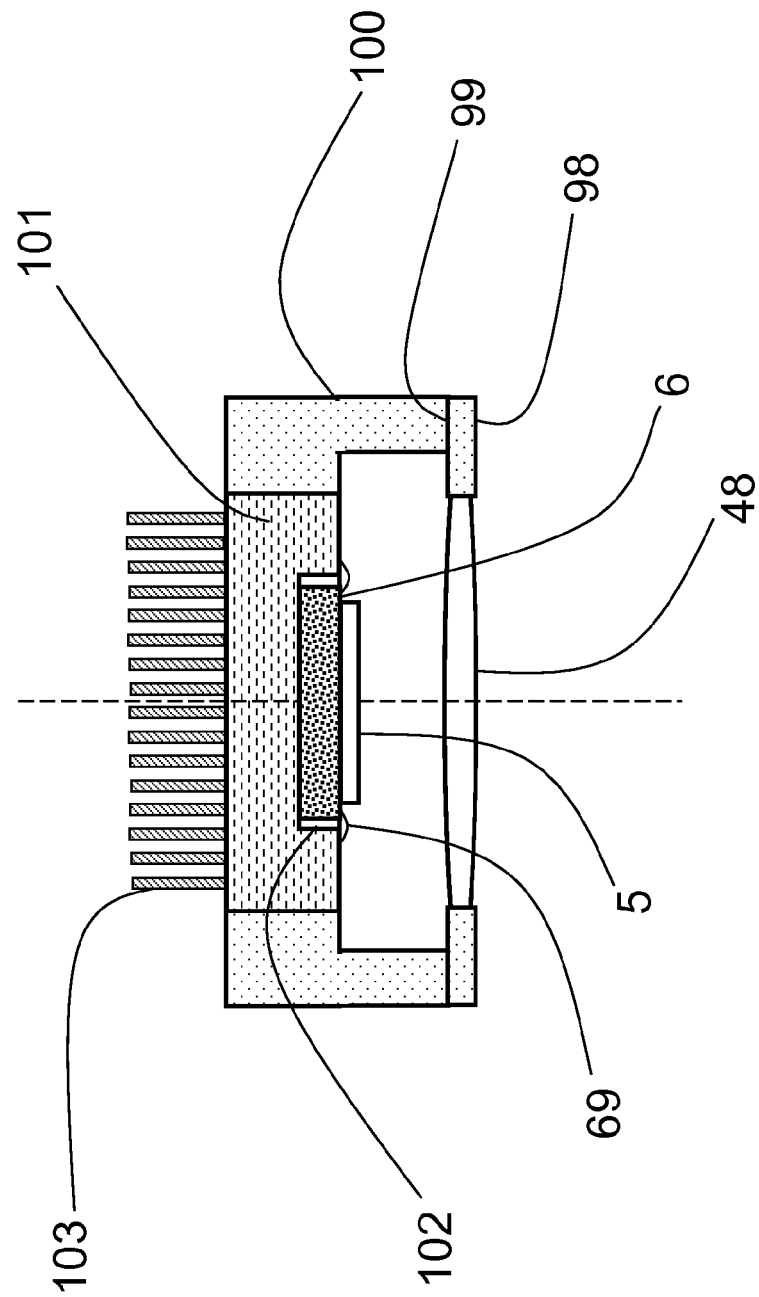
FIGURE 11. Optical Receiver Hybrid PGA

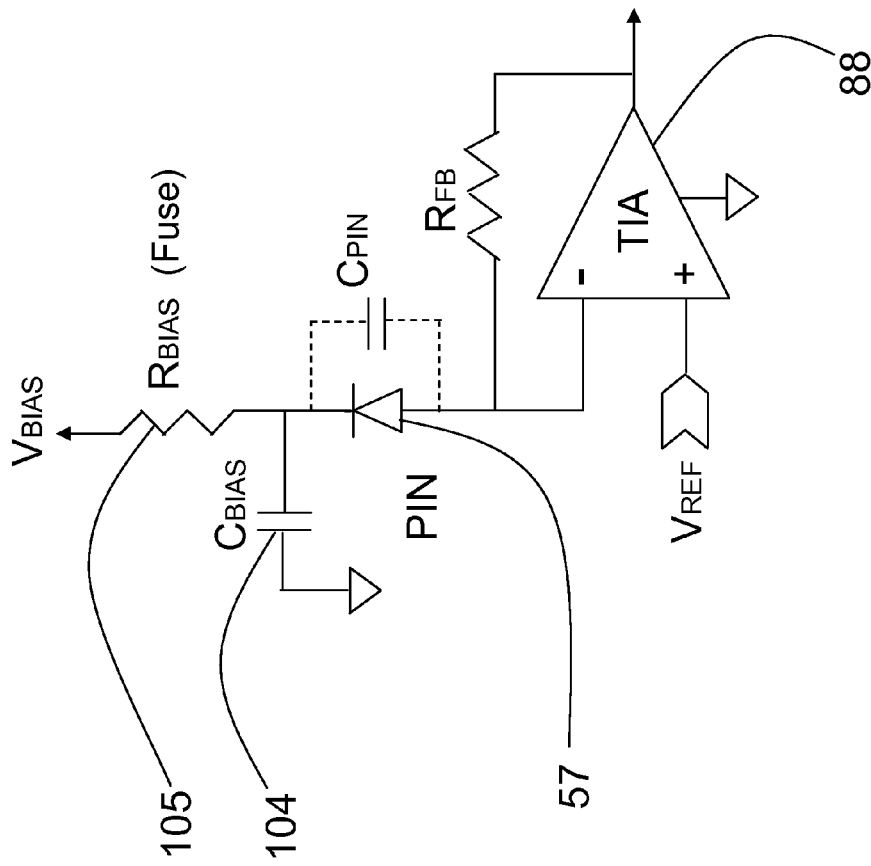
FIGURE 12. Detector Bias Feed

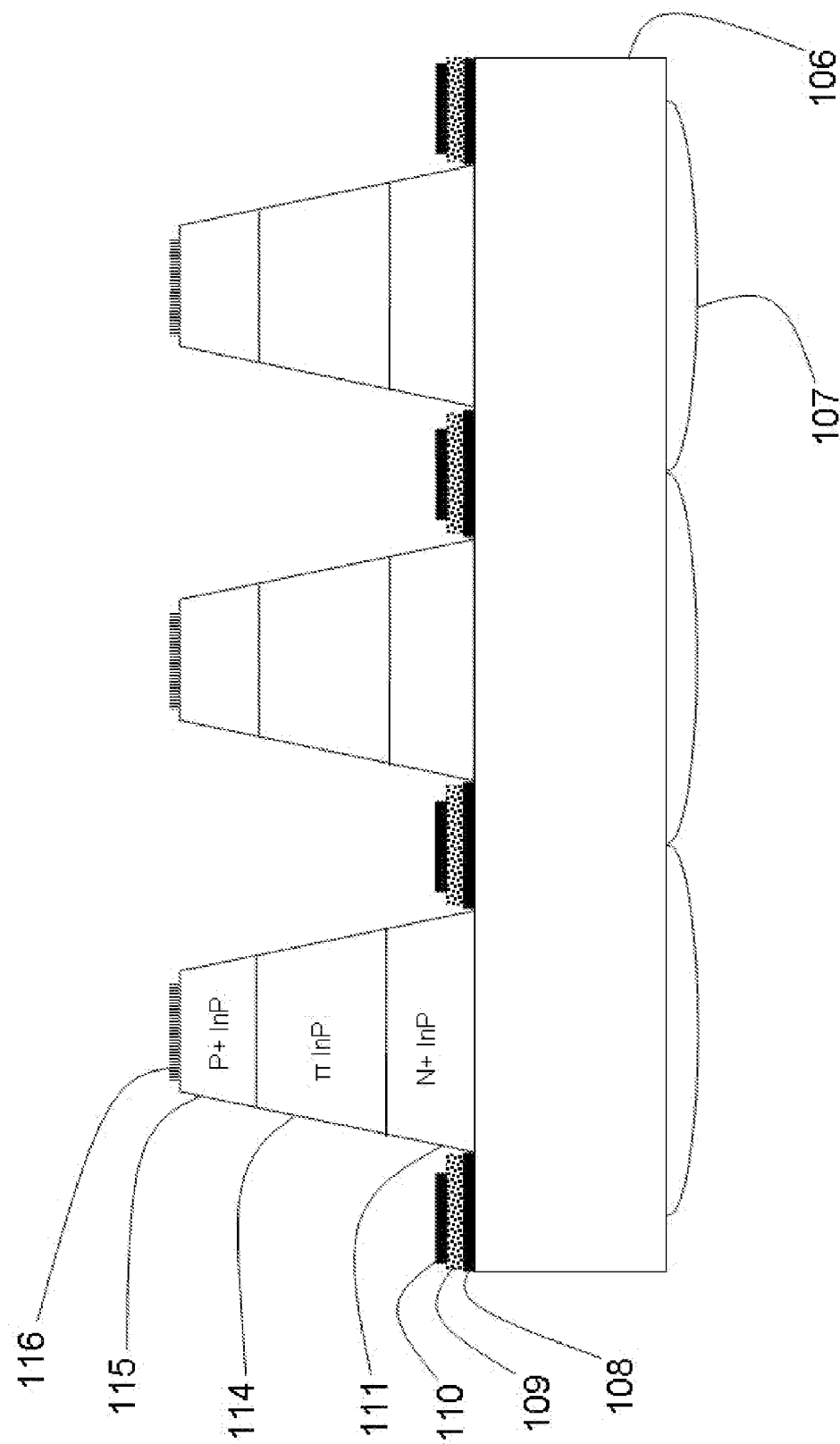
FIGURE 13. PIN Array with Capacitive Voltage Grid

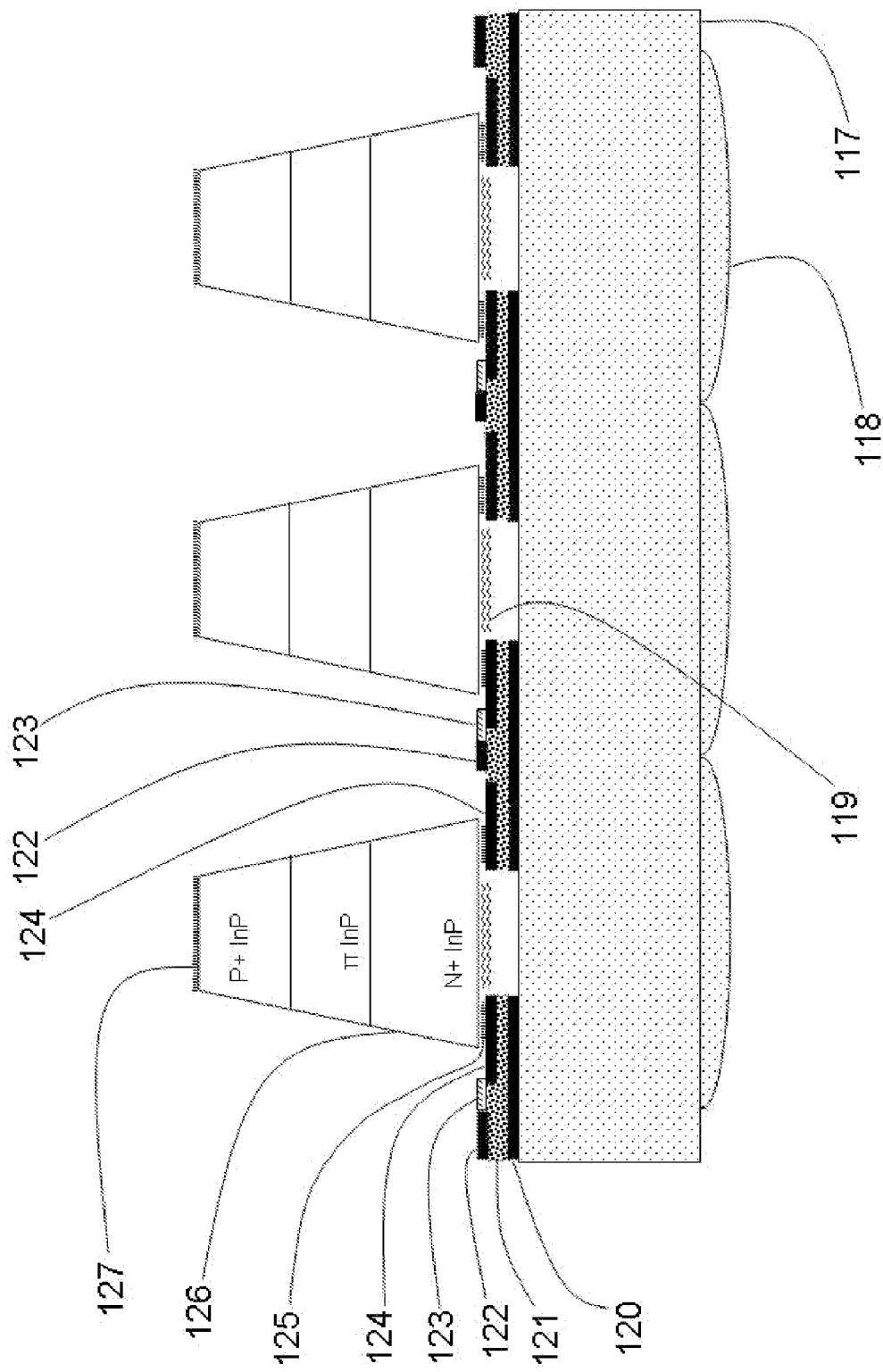
FIGURE 14. Advanced PIN Detector Array

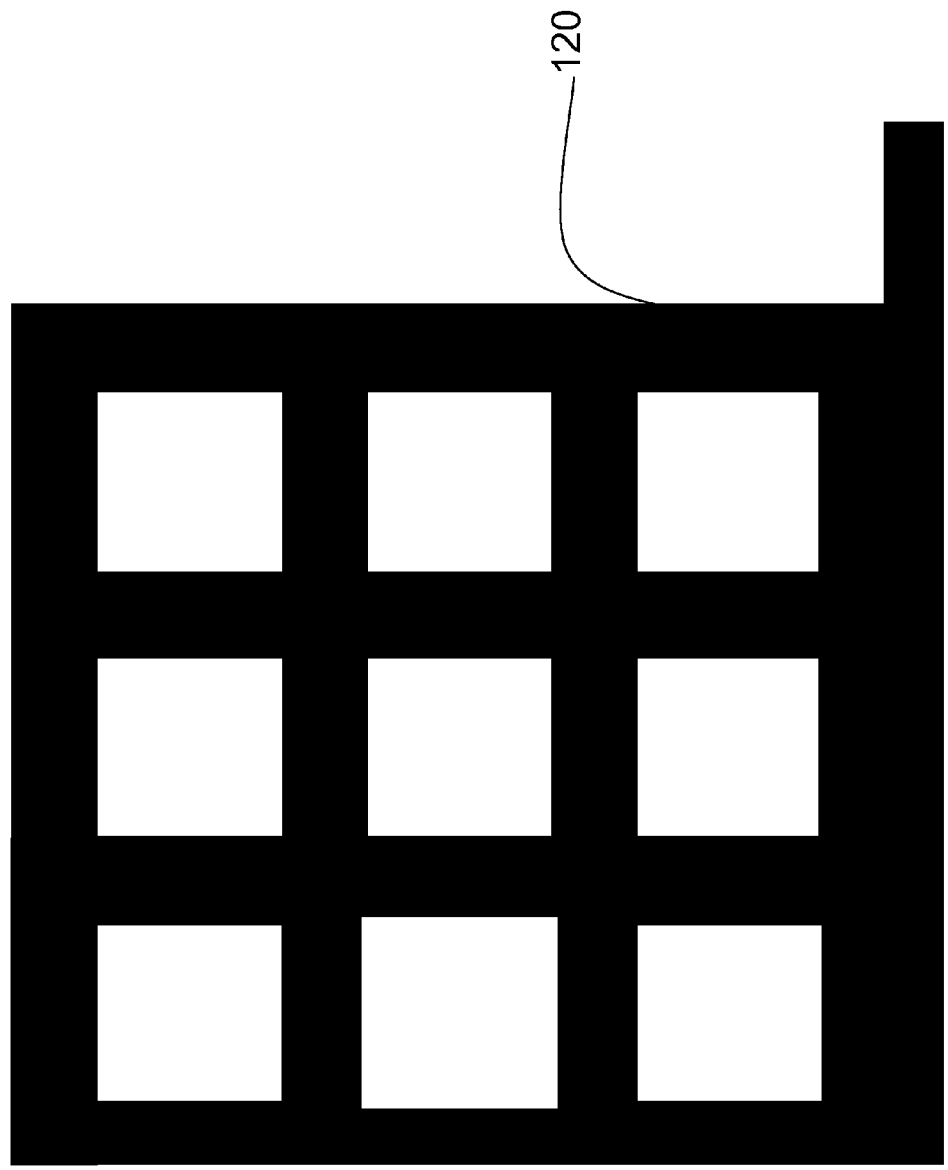
FIGURE 15. Layer 1 Ground Plane Grid

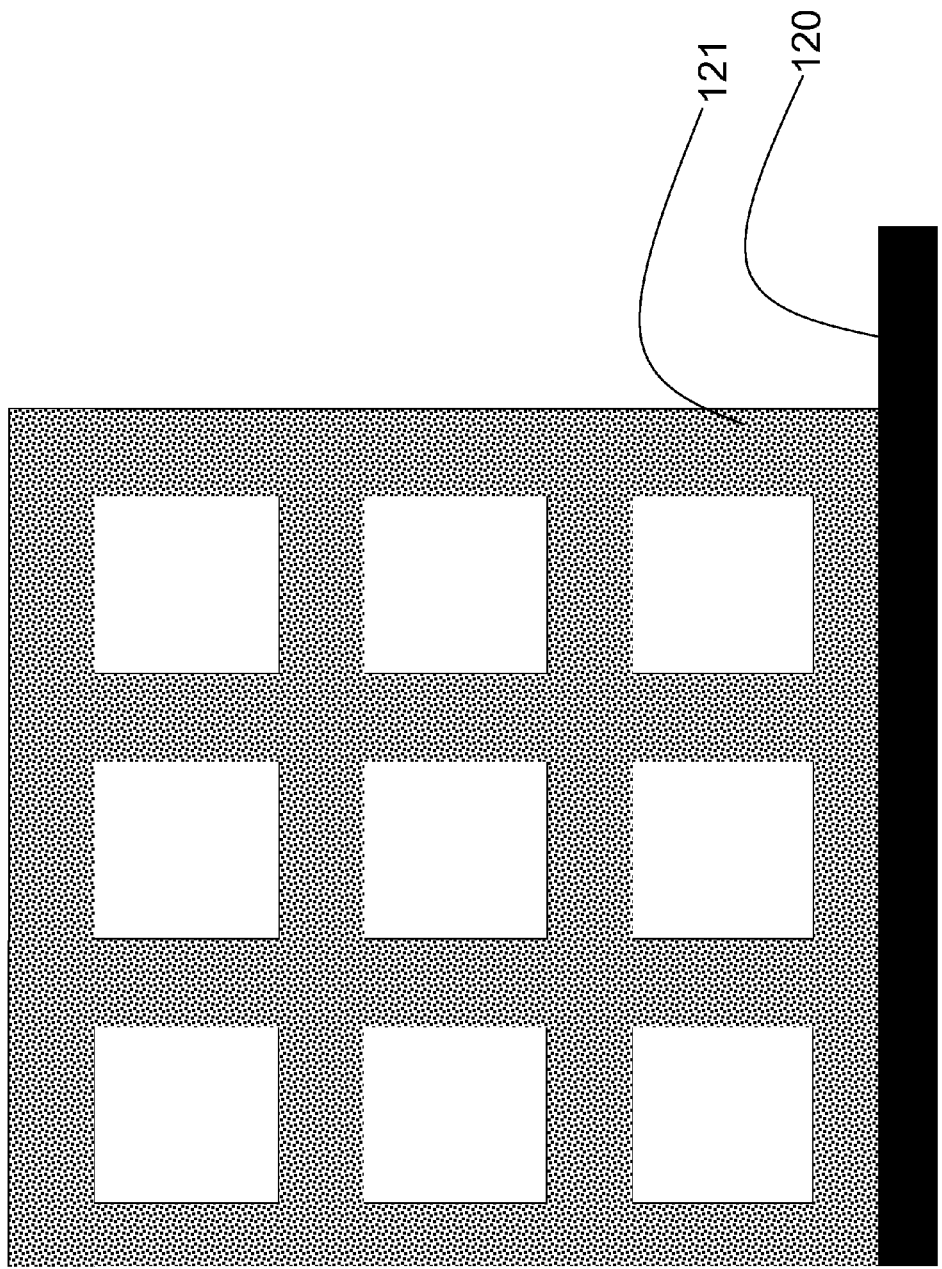
FIGURE 16. Layer 2 Silicon Nitride Over Ground

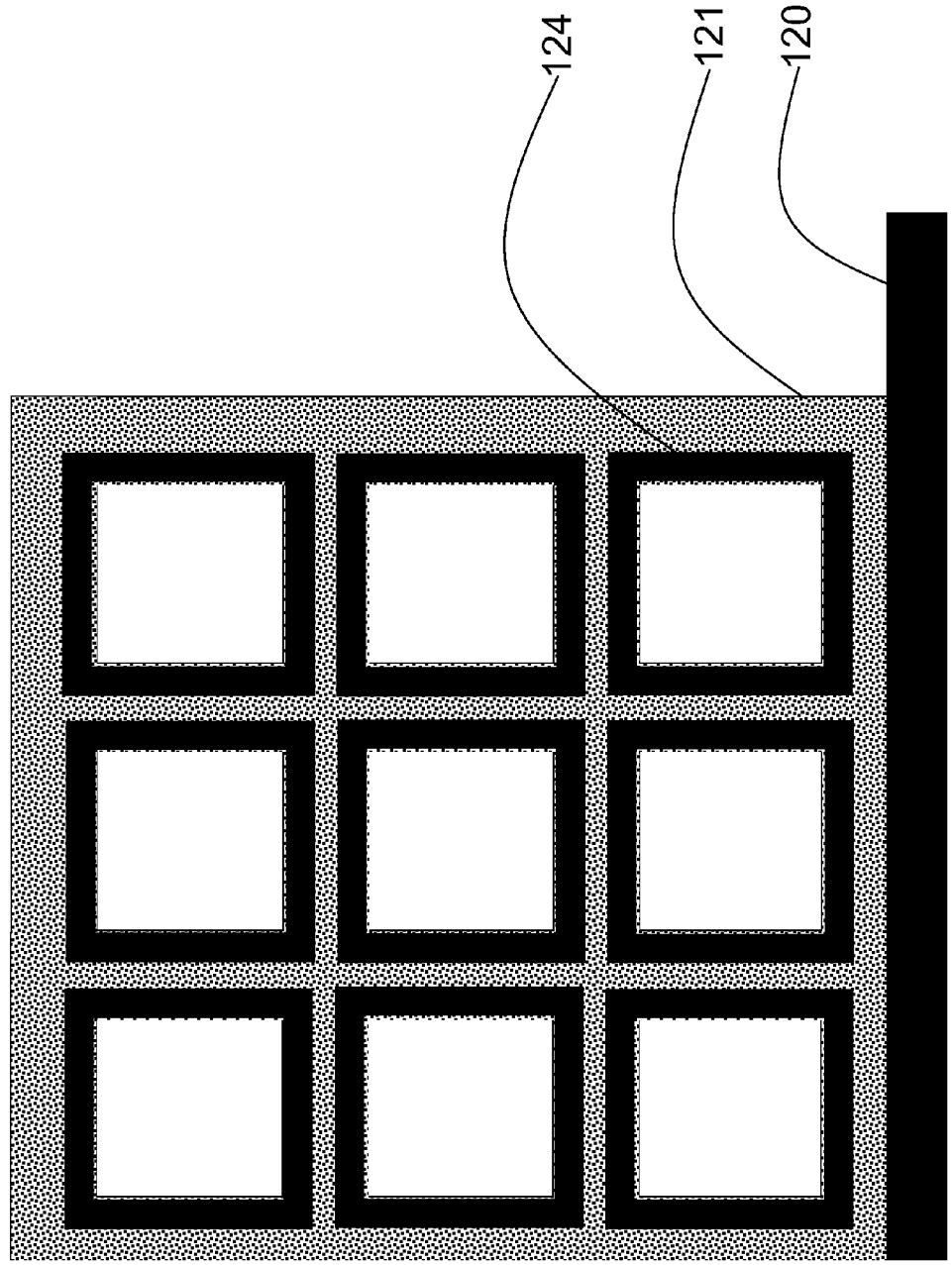
FIGURE 17. Layer 3 Cathode Ring Contact Metallization

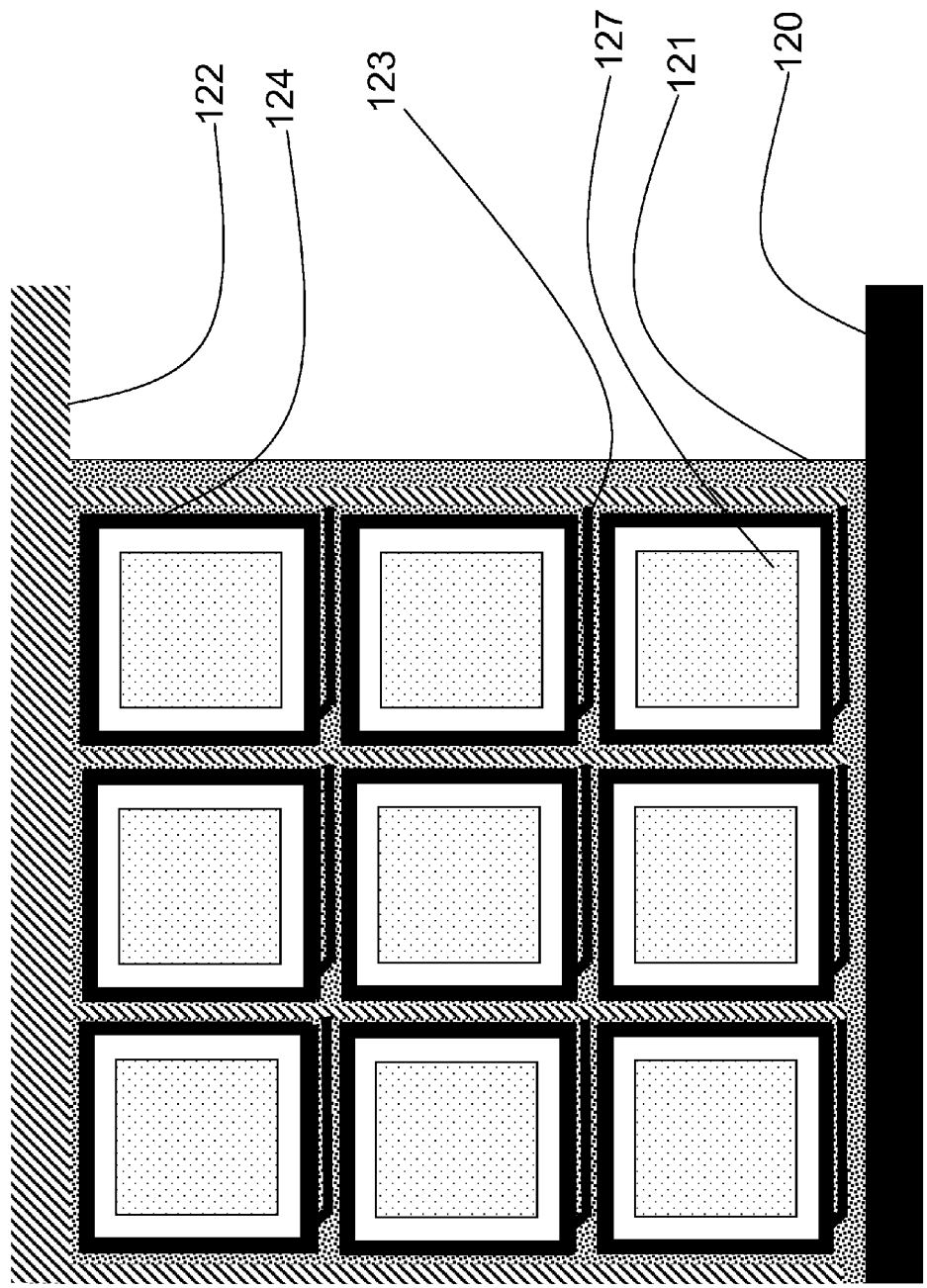
FIGURE 18. Layer 4 Voltage Plane & Resistive Film

TERRAIN MAPPING LADAR SYSTEM

RELATED APPLICATIONS

This application claims priority to provisional patent application Ser. No. 61/532,371, filed Sep. 8, 2012, which is incorporated herein by reference. Additionally, this application incorporates herein by reference the disclosures of U.S. Pat. Nos. 5,696,577, 6,133,989, 5,629,524, 6,414,746, 6,362,482, and U.S. Patent Application Publication No. US 2002-0117340.

BACKGROUND OF THE INVENTION

The 3-D imaging technology disclosed in Stettner et al, U.S. Pat. Nos. 5,446,529, 6,133,989 and 6,414,746 provides with a single pulse of light, typically pulsed laser light, all the information of a conventional 2-D picture along with the third dimensional coordinates; it furnishes the 3-D coordinates of everything in its field of view. This use is typically referred to as flash 3-D imaging in analogy with ordinary digital 2-D cameras using flash attachments for a self contained source of light. As with ordinary 2-D digital cameras, the reflected light is focused by a lens on the focal plane of the LADAR sensor, which contains an array of pixels called a focal plane array (FPA). In the case of the terrain mapping LADAR sensor these pixels are "smart" and can collect data from which the time of flight of the laser pulse to the object of interest can be calculated. Each smart pixel also collects data associated with the returning laser pulse shape and magnitude.

One value of these flash LADAR sensors, as opposed to competing designs in which one or more pixels is scanned over the field of view, is the elimination of the precision mechanical scanner, which is costly, high maintenance and typically large and heavy. The pixels in the focal plane of a flash LADAR sensor are automatically registered due to their permanent positions within the array. Further, by capturing a frame of data as opposed to one or a few pixels with one laser pulse, the data rate is greatly increased while weight and volume are reduced. Because each frame of data is captured from the reflection of a short duration laser pulse, moving objects or surfaces of stationary objects may be captured from a moving platform without blurring or distortion. The instant invention is a flash LADAR sensor specifically adapted to a low cost, lightweight, unmanned aerial vehicle (UAV) further adapted for terrain mapping applications.

The first embodiment of the terrain mapping flash ladar sensor includes stationary optics and a focal plane array of two rows of N pixels each (2×N array), where N=128 for example. If the ladar sensor platform is in motion and the ladar sensor covers the entire field of view (FOV) normal to the platform motion on the ground, then a continuous 3-D map can be generated by pulsing the laser fast enough so frames are overlapped without the necessity of any moving mechanical parts. At higher speeds or higher elevations, a mechanical pivot advances the angle of the illuminating laser pulse so it will be received on the return path by one of the rows of the focal plane array. Alternatively, for high speed platform motion or high altitude, the mechanical pivot may be eliminated and the focal plane array may be moved linearly rearward by a linear motion translation stage, so the illuminating laser pulse may be received by one of the rows of the focal plane array. For larger fields of view, or higher motion velocity, larger M×N or N×N focal plane arrays can be generated by making arrays with a greater number of rows and columns, or by using multiple smaller focal plane arrays.

In all the terrain mapping flash LADAR sensor embodiments, flash ladar data is developed into a 3-D map using software which stitches the frames together. By using a proper water-penetrating laser wavelength and a particular "range gated" data collection mode in the terrain mapping flash ladar, underwater objects and sea floors and lake bottoms can be mapped. The same mode of operation will allow mapping through smoke and fog or mapping of smoke, fog, or gas clouds.

SUMMARY OF THE INVENTION

The present invention is comprised of a ladar platform, a system controller with inertial and positional references, a system memory, a pulsed laser, transmit optics, receive optics, a 3-D FPA, a readout integrated circuit, a camera electronics and image processor circuit assembly, a detector bias control circuit to control the 3-D FPA, and the system controller with capability to output the 3-D FPA data and process and store the data. Each pixel in the 3-D FPA converts the laser light falling on it into an electronic signal whose magnitude is sampled in time and stored in memory within the pixel. Each pixel also uses a clock to time the samples being taken in response to the captured reflection of the laser light from a target's reflecting feature. Different embodiments of the invention may include various pulsed laser sources, may include a motorized angular pivot, a linear focal plane array translation stage, or may include 2-D sensors. 2-D sensor data may be overlaid or textured on the 3-D data to generate more realistic, higher resolution, or more identifiable maps. A further embodiment makes use of a blue-green laser transmitter and a pressure sensor for bathymetry from an underwater platform.

It is the objective of the present invention, in separate embodiments, to generate data for 3-D topographical, ocean surface, underwater, or terrestrial maps. Uses of these maps include salvage operations, navigation, and reconnaissance.

Among the advantages of this device is its mechanical simplicity and high data rate. Low weight and low volume for the device are additional advantages and stem from the use of 3-D FPAs. Other advantages and uses of the invention will be apparent to those skilled in the art.

BRIEF DESCRIPTION OF THE DRAWINGS

FIG. 1 is a system block diagram of the present invention adapted for mounting in a lightweight aircraft as a push broom topographical mapping system.

FIG. 2 is a side view of a typical UAV installation and a number of terrain features and their spatial relationship to the push broom topographical mapping system of the present invention.

FIG. 3 shows the installation of a pulsed laser transmitter on a motorized pivot mount of the present invention.

FIG. 4 shows features of a hybrid optical receiver including the detector and readout IC hybrid comprising the 3-D FPA of the present invention.

FIG. 5 is a diagram revealing features of a basic detector and readout IC hybrid assembly comprising the 3-D FPA including a capacitive voltage grid of the present invention.

FIG. 6 is a diagram showing the 3-D focal plane array mounted to a host circuit assembly in a preferred embodiment.

FIG. 7 is a diagram showing a focal plane array detector integrated with a readout circuit on the same semiconductor chip and mounted to a host circuit assembly.

FIG. 8 is a drawing of a discrete focal plane array of individual detectors mounted to a supporting lens array and then to a readout integrated circuit.

FIG. 9 shows a discrete focal plane array of the instant invention mounted to a host circuit assembly in a preferred embodiment.

FIG. 10 is a functional block diagram of the unit cell electronics associated with each pixel of the focal plane array of the instant invention.

FIG. 11 is a cutaway view of an optical receiver hybrid package with electrical connections comprising a pin grid array.

FIG. 12 is a schematic diagram showing a preferred circuit for supplying bias voltage to a cathode of a semiconductor diode used as an optoelectronic detector element.

FIG. 13 is a side view of the fine structure of a focal plane array of photodiodes with a bias voltage distribution grid featuring a distributed capacitance.

FIG. 14 is a side view of an advanced photodiode array with a bias voltage distribution grid featuring resistive isolation and fusing, and individual detector bias voltage decoupling capacitance.

FIG. 15 is a top view of the artwork associated with the ground plane of the advanced photodiode array of FIG. 14.

FIG. 16 is a top view of the artwork associated with the insulating layer and underlying ground plane of the advanced photodiode array of FIG. 14.

FIG. 17 is a top view of the artwork associated with the capacitive cathode ring, insulating layer, and underlying ground plane of the advanced photodiode array of FIG. 14.

FIG. 18 is a top view of the complete assembly of the advanced photodiode array of FIG. 14 including the resistive stripe, bias voltage distribution grid, capacitive cathode ring, insulating layer, and underlying ground plane.

DETAILED DESCRIPTION OF THE PREFERRED EMBODIMENTS

A preferred embodiment of the present invention, the Terrain Mapping LADAR, is depicted in block diagram form in FIG. 1. A system controller 1 controls the functions of the major components of the terrain mapping LADAR system. System controller 1 connects to pulsed laser transmitter 2 through bidirectional electrical connections which transfer commands from system controller 1 to pulsed laser transmitter 2 and return monitoring signals from pulsed laser transmitter 2 to the system controller 1. An optical sample of the outbound laser pulse is routed to a corner of the detector array 5 as an automatic range correction (ARC) signal, typically over a fiber optic cable. The pulsed laser transmitter 2 may be a solid-state laser, monoblock laser, semiconductor laser, fiber laser, or an array of semiconductor lasers. It may also consist of more than one individual laser to increase the data rate. In the preferred embodiment, pulsed laser transmitter 2 is a disc shaped solid state laser of erbium doped phosphate glass pumped by 976 nanometer semiconductor laser light. In an alternative embodiment, pulsed laser transmitter 2 is an array of vertical cavity surface emitting lasers (VCSELs).

In operation, the system controller 1 initiates a laser illuminating pulse by sending a logic command to pulsed laser transmitter 2, which responds by transmitting an intense pulse of laser light through transmit optics 3. Transmit optics 3 diffuses the high intensity spot produced by pulsed laser transmitter 2 substantially uniformly over the desired field of view to be imaged by the terrain mapping ladar sensor as can be seen in FIGS. 2 & 3. An optical sample of the transmitted laser pulse (termed an ARC signal) is also sent to the detector array 5 via optical fiber. A few pixels in a corner of detector array 5 are illuminated with the ARC (Automatic Range Correction) signal, which establishes a zero time reference for the timing circuits in the readout integrated circuit (ROIC) 6. Each unit cell of the readout integrated circuit 6 has an associated timing circuit which is started counting by an electrical pulse derived from the ARC signal. When some portion of the transmitted laser pulse is reflected from a feature in the scene in the field of view of the terrain mapping ladar sensor, it may be reflected onto an individual detector element of the detector array 5. This reflected laser light optical signal is then detected by the affected detector element and converted into an electrical current pulse which is then amplified by an associated unit cell electrical circuit of the readout integrated circuit 6, and the time of flight measured. Thusly, the range to each reflective feature in the scene in the field of view is therefore able to be measured by the terrain mapping ladar sensor.

An optional motorized pivot mount allows the illuminating beam of the pulsed laser transmitter 2 to be advanced or retarded in the direction of motion of the ladar platform. In a second preferred embodiment, for high speed platform motion or high altitude mapping, the mechanical pivot is eliminated and the focal plane detector array 5 is moved linearly rearward by a linear motion translation stage, so the illuminating laser pulse will be incident upon one of the rows of the focal plane array. The focal plane array and readout integrated circuit may be an M×N or N×N large array. Transmit optics 3 consisting of a cylindrical lens, holographic diffuser, diffractive grating array, or microlens array, condition the output beam of the pulsed laser transmitter 2 into a proper fan shaped beam for illuminating a thin and wide section of terrain or ocean bottom underneath the ladar platform. The combination of pulsed laser transmitter 2, transmit optics 3, and optional motorized pivot or linear translation stage, comprise a velocity compensating illuminator 20, which is shown with the dashed line boundary in FIG. 1. The preferred embodiment of the terrain mapping ladar sensor is for a lightweight unmanned aerial vehicle or remotely controlled submersible, and is designed to be as low cost, low weight and low volume as reasonably practical. A single axis motorized pivot raises the cost, mass, and power consumption of the terrain mapping ladar sensor but may be necessary for high altitude or high speed mapping applications. A linear translation stage for adjusting the position of the focal plane array fore and aft may be an even lower cost and lower weight velocity compensation structure as an alternative to a motorized pivot. A dual axis gimbal pivot is a third alternative embodiment of the terrain mapping ladar sensor, though not a preferred option, owing to the even greater expense, mass, and power consumption. A dual axis gimbal can be useful for increasing swath width or coverage area and would typically be used with a square or rectangular (M×N) FPA as opposed to a 2×N FPA. The associated scan pattern might be left to right and then right to left where the FPA advances one or more rows in the direction of motion each time the gimbal scans laterally.

Continuing with FIG. 1, receive optics 4 consisting of a convex lens, spherical lens, cylindrical lens, or diffractive grating array captures pulsed laser light reflected from a scene in the field of view of the terrain mapping ladar sensor. Receive optics 4 collect the light reflected from the scene and focus the collected light on the detector array 5. Detector array 5 is typically formed on an indium phosphide semiconducting substrate with a set of cathode contacts exposed to the light and a set of anode contacts electrically connected to the supporting readout integrated circuit 6. The cathode contacts of the individual detectors of detector array 5 are typically connected to a high voltage detector bias grid on the illuminated side of the detector array 5 and then to a supporting circuit assembly. Each anode contact of the detector elements of detector array 5 is independently connected to an input of a unit cell electronic circuit of readout integrated circuit 6. Readout integrated circuit 6 comprises a rectangular array of unit cell electrical circuits, each unit cell with the capability of amplifying a low level photocurrent received from an optoelectronic detector element of detector array 5, sampling the amplifier output, and detecting the presence of an electrical pulse in the unit cell amplifier output associated with a light pulse reflected from the scene and intercepted by the detector element of detector array 5 connected to the unit cell electrical input. The detector array 5 may be a P-on-N design or N-on-P design with the dominant carrier being holes or electrons respectively; the corresponding ROIC would have the requisite polarity. Additionally, particularly for underwater mapping, the semiconductor substrate may be silicon.

The hybrid assembly of detector array 5 and readout integrated circuit 6 is mounted to a camera electronics and image processor 9 printed circuit assembly. The camera electronics and image processor 9 circuit assembly supplies conditioned power and ground, a reference clock signal, calibration constants, and selection inputs for the readout column and row, among other support functions, while receiving and registering range and intensity outputs from the readout integrated circuit 6 for the individual elements of the detector array 5. A detector bias control circuit 7 applies a time varying detector bias to the detector array 5 which provides optimum detector bias levels to reduce the hazards of saturation in the near field of view of detector array 5, while maximizing the potential for detection of distant objects in the field of view of detector array 5. The contour of the time varying detector bias supplied by detector bias control circuit 7 is formulated by image analysis and bias vector processor 8 based on the reflectivity and distance of objects or points in the scene in the field of view of the detector array 5.

System controller 1 also controls the interactions with external systems hosted on the ladar platform through bidirectional communications interface 16, which may be a serial or parallel communications interface, depending on the application and level of integration with the ladar platform electronics. Communications interface 16 is an Ethernet serial interface in a preferred embodiment. System controller 1 also receives inputs from a system memory 15 which loads operating firmware on wake-up, acts as a cache for system controller 1, and may also act as a permanent data recording device in a manner similar to a flight data recorder. System memory 15 is typically flash memory in the preferred embodiment, but may also be a combination of volatile and non-volatile memory, or magnetic memory in some cases. The connection between system controller 1 and system memory 15 is a bidirectional parallel or serial electrical interface. The terrain mapping ladar sensor also has a positional reference 11, typically a global positioning system (GPS) receiver which receives position data through antenna 10 mounted to the ladar platform. An inertial reference 12 allows the terrain mapping ladar sensor to calculate position of the platform between updates of the positional reference 11. There are zones where GPS may be unavailable, or times where the GPS system may be unavailable, so inertial reference 12 may be a simple MEMs based tuning fork type of reference, or a more capable aviation type gyroscope or even a ring laser gyroscope. A pressure sensor 13 provides an underwater mapping platform a depth gauge for underwater mapping applications. The system controller 1 controls and receives data via bidirectional electrical interfaces 14 which may be parallel, serial, or a combination of serial and parallel structures, or may be a single parallel bus architecture using shared media. The bidirectional electrical interfaces 14 connect the system controller 1 to the camera electronics and image processor 9, the image analysis and bias vector processor 8, the positional reference 11, the inertial reference 12, and the pressure sensor 13, at minimum. If the terrain mapping LADAR sensor is to be used in guidance of the ladar platform a bidirectional interface will exist between the system controller 1 and the navigation guidance and control system for the ladar platform.

FIG. 2 shows two typical terrain mapping applications which are addressed by the terrain mapping ladar sensor. An aerial ladar platform 17, typically an unmanned aerial vehicle (UAV) is flying through a distance x in a forward direction at a height h. The UAV 17 will travel forward a distance $\Delta x$ in a time $\Delta t$. The incremental time $\Delta t$ is a measure of the time of flight of a laser pulse from the time it leaves the transmit optics 3 until it reflects off a feature in the terrain and returns through receive optics 4 and is detected by an element of detector array 5. A GPS antenna 18 receives positional reference data from orbiting satellites, and a radome 19 is positioned on a lower surface and forward on ladar platform 17. Radome 19 is transparent at the wavelength of the laser light emanating from the pulsed laser transmitter 2. Given a fixed and minimum forward velocity of the UAV ladar platform, the distance travelled in the forward direction $\Delta x$ will increase with increasing height h, and it may be necessary to advance the illuminating pulsed laser beam a small angle $\Theta$ as shown in the diagram of FIG. 2. Normally, the path of the illuminating pulsed laser beam is boresighted with the receive optics 4 at low altitudes. At low altitude, because the speed of light is so great, no appreciable forward movement $\Delta x$ takes place during the time of flight $\Delta t$, so it is not necessary to advance the illuminating pulsed laser beam. At high altitude h or with high speed forward motion of the ladar platform, an increase in the advance angle $\Theta$ may be necessary. For example, at a height h of 300 meters the round trip time of flight will be approximately 2 uS. If the UAV 17 travels in a forward direction at 25 mph, then the ladar platform 17 will have moved only 23 microns, less than one third of the diameter of a typically sized detector element of detector array 5. In this case, it would not be necessary to create an advance angle to compensate for forward motion of the ladar platform 17. With the detectors typically of 70 micron diameter on an 80 micron pitch, forward motion of the ladar platform would not need to be compensated unless the forward speed increased beyond 75-100 mph at the 300 meter height, since there are at least two rows of detector elements in detector array 5, and the second row of detector elements would receive the reflected pulsed laser light as the forward speed of the ladar platform increased up to the 100 mph rate. In a second preferred embodiment, detector array 5 is mounted on a small linear translation stage within system/receiver 26. Velocity compensation may be accomplished in this second preferred embodiment by moving detector array 5 forward or rearward in the line of motion of ladar platform 17. Higher speeds and altitudes may in a third alternative embodiment be accommodated by increasing the number of rows beyond the two rows of the preferred embodiment, though with some negative effect on system power consumption and complexity. The number of rows may increase up to 128 in a preferred embodiment, resulting in a detector array 5 of 128×128 detector elements. High altitude performance may additionally require a higher power output pulse from pulsed laser transmitter 2. In any event, camera electronics and image processor 9 compensates each measurement of range and intensity for motion of the ladar platform 17, by using the positional reference 11 and the inertial reference 12 to remove the effects of ladar platform 17 motion.

The drawing of FIG. 2 shows a velocity compensating illuminator 20 within radome 19 and the remainder of the terrain mapping ladar sensor shown as system/receiver 26 which comprises the optional linear translation stage and all of the remaining elements 1-16 of FIG. 1 minus the pulsed laser transmitter 2, transmit optics 3, and optional motorized pivot. Velocity compensating illuminator 20 is illustrated within the circular dashed line at top left of FIG. 2, and comprises mounting bracket 21 with mounting holes shown as dashed lines, pedestal yoke 22, pivot bearing 23, rotor 24, and ladar transmitter 25. Ladar transmitter 25 comprises pulsed laser transmitter 2 and transmit optics 3, and is securely attached to rotor 24 by screws, rivets, or other reliable mechanical means. Pedestal yoke 22 houses an electrical motor stator portion, and rotor 24 is the accompanying rotor for the electrical motorized pivot.

Flying over the zone to be mapped, ladar platform 17 enables the terrain mapping ladar sensor to send out a laser pulse from velocity compensating illuminator 20 (dashed lines), and receives a return laser pulse in system/receiver 26 which has been reflected from a feature in the terrain. In the drawing of FIG. 2, the feature in the scene is Quonset hut 27 built on the land 28 close to the tidal zone of an ocean 29. If the wavelength of the laser light transmitted by the pulsed laser transmitter 2 of the preferred embodiment is 0.53 microns, penetration of the ocean depth is anticipated to approximately 2 to 5 diffuse attenuation lengths (a measure of water turbidity), allowing for the terrain mapping ladar sensor to view and map the storm sewer pipe 35 at a depth of a few meters, the tethered anti-shipping mine 34 at a depth of approximately 10 meters or less and the ocean bottom 33 shipwreck 32 at a depths 50 to 100 meters. Floating mine 34A may be a surface floating mine, a subsurface floating mine, or an oscillating mine which floats up to the surface and back down to a prescribed depth in a periodic fashion. Depending upon water turbidity; the terrain mapping LADAR sensor may also be configured to map the ocean waves. The velocity compensating illuminator 20 may also be used to provide a multiple look capability to image regions that may have been obscured by a breaking wave. Under these circumstances, after taking a frame of data from a particular position on the ocean surface, the Terrain Mapping LADAR Sensor would be made to look back at the same position after the time it takes a typical wave to break. A multiple look capability prevents blank regions in the mapping data record, because breaking foam is highly reflective of laser light, and it is particularly obstructive in the mapping of the ocean bottom 33 in the surf zone.

The use of a specially adapted submarine ladar platform 30 which uses a blue (450-490 nm) or green (520-540 nm) pulsed laser transmitter 2, within a pressure vessel allowing it to dive to some depth, will increase the depth capability of the underwater survey. Mapping of the ocean depths is referred to in the art and later herein, as bathymetry. Submarine ladar platform 30 has a terrain mapping LADAR with all the described features of the instant invention, including velocity compensating illuminator 20 and system/receiver 26, mounted within a pressure resistant radome 31 which is transparent to light in the preferred blue or green wavelengths between 0.45-0.53 um of the pulsed laser transmitter 2. Very deep ocean bottoms may be mapped by a combination of higher power laser pulses from pulsed laser transmitter 2, and/or a submarine ladar platform 30 capable of operating at greater depths. In the case of underwater mapping, camera electronics and image processor 9 compensates each measurement of range and intensity for motion of the submarine ladar platform 30 using the onboard positional reference 11, the inertial reference 12, and the pressure sensor/depth gauge 14 to remove the effects of motion of submarine ladar platform 30. If the width of the sweep of the terrain mapping ladar sensor is not great enough, the path of the ladar platform 17 or 31 may be controlled to produce a spiral search pattern, a rectangular rastered pattern, or any other preferred search protocol. A slight roll may be introduced into the ladar platform 17 or 31 to produce an increase in the mapped terrain to the left or right of the direction of travel. The optional motorized pivot may also be used to compensate for pitch up or pitch down due to external forces on the ladar platform 17 or 31. Additionally, the optional motorized pivot may be used to rescan areas which might have been temporarily obscured, e.g., a submerged rock obscured by a wave breaking in shallow water.

FIG. 3 is an illustration of a preferred embodiment of the velocity compensating illuminator 20. Common to FIG. 2 are the mounting bracket 21, pedestal yoke 22, motorized pivot 23, and rotor 24. The pulsed laser transmitter 2 is positioned interior to the cylindrical lens 36 of the preferred embodiment. On the left side of FIG. 3 is shown a side view of velocity compensating illuminator 20, with the symmetrical lens supports 37 counterbored to provide lens mount recesses 38 designed to hold the circular profile of cylindrical lens 36 securely. The right side of FIG. 3 shows a section of the velocity compensating illuminator 20 taken along line AA, clearly showing the circular profile of cylindrical lens 36. The fan-shaped projection 40 of the light from pulsed laser transmitter 2 is also shown as the hatched pattern on landscape 41. Other types of diffusing lenses are anticipated which are capable of shaping the illuminating beam in a similar fashion, including diffractive arrays and holographic diffusing lenses.

FIG. 4 is a cutaway diagram of a hermetically packaged detector array 5 and readout IC 6 hybrid structure. The package is broadly described in the industry parlance as a "quad flatpack", though other terms may be used, and the present embodiment has several features which distinguish it from a standard quad flatpack. Shown at the left of FIG. 4 is a left side cutaway view showing a Covar® base 42, selected for its excellent matching with the thermal expansion coefficients of glass and silicon. Covar® base 42 is typically formed in the shape of a four sided tub, and may be deep-drawn in volume production, or machined in small quantities. An optional thermal enhancement to the package, formed by making a cutout in the center of the bottom of the base 42, and brazing heat sink/spreader 43 of copper-tungsten or copper molybdenum alloy to the base 42, will assist in the removal of heat from the readout integrated circuit 6, which is eutectically bonded or epoxied to the base 42. The four side walls 44 of tub shaped base 42 are perforated to allow for flat leads 45 to be inserted and held in place by glass seals 46. Flat leads 45 are typically in leadframes, and are photo-etched or stamped from sheets of beryllium-copper alloy which have a thickness from 0.25 mm to 1.0 mm, each lead with a width of 0.4 mm to 0.675 mm. In the preferred embodiment, all four sides 44 of base 42 are utilized, with a total of 176 leads split among the four sides. A rectangular metal cover 47 with an integral glass window 48 is welded, soldered, or epoxied to the entire periphery of side walls 44. In a preferred embodiment, a continuous seam is formed by weldment 49 to create a hermetically sealed package for detector array 5 and readout integrated circuit 6. Prior to attachment of the cover 47, a circuit substrate 51 is attached to the base 42 to breakout the fine pitch leads which are on 0.1 mm centers on the readout IC 6 to the 1.25 mm pitch typical of the package periphery. Also prior to attachment of the cover 47, the flat leads 45 are soldered to the circuit substrate 51 using solder 50, and wirebonds 53 are made between readout IC 6 and circuit substrate 51. The thickness of substrate 51 is chosen to closely match the thickness of readout IC 6 so minimal length wirebonds 53 can be made between readout IC 6 and substrate 51, enhancing high frequency electrical performance of the package. Circuit substrate 51 is typically formed of alumina or aluminum nitride, with a bondable gold thick film circuit screened and fired on the surface. Multiple layers of dielectric and additional circuit layers and conductive vias are added, to accommodate the complexity of the readout IC 6 and the circuits external to the package. Additionally, resistors and low value capacitors and inductors may be screened on and co-fired with the circuit layers. High value inductors and capacitors may be picked and placed on circuit substrate 51 and epoxied with a conductive epoxy or soldered in place prior to attachment of the substrate 51 to the base 42. Circuit substrate 51 may also be formed using a thin film process which starts by uniformly coating substrate 51 with thin metal films, and removing portions of the film photolithographically as in standard printed circuit board processing. In some applications, a printed circuit board of glass-epoxy laminate may be used as circuit substrate 51, with a bondable gold plating applied selectively to the wirebond pads. Shown at the right of FIG. 4 is an alternative method of connecting circuit substrate 51 to flat leads 45 using wirebonds 52 to make the connection. Flat leads 45 may alternatively be of a circular cross-section, or of other geometry suited to a particular application without reducing or substantially altering the many benefits of the instant invention. An optional tube 54 allows for backfilling of the package with an inert gas such as argon or nitrogen, or evacuation of the atmosphere in a vacuum environment. Tube 54 may be pinched, filled with solder, or otherwise sealed upon completion of any backfilling or evacuation process.

FIG. 5 shows a top view of the detector array 5 and readout integrated circuit 6 hybrid assembly. Wirebondable bond pads 55 on readout integrated circuit 5 occupy the periphery of the chip, and are typically comprised of a thin metal coating applied by evaporation in a vacuum chamber. A sequence of titanium followed by platinum and then gold produces a bondable gold pad with excellent adhesion to silicon readout integrated circuit 6 with an adequate barrier to gold migration. Other metallization schemes such as titanium/nickel/gold may be used with a similar beneficial effect. The unit cell electronics 56 associated with each detector element 57 of detector array 5 are shown interior to the boundary formed by bond pads 55. Because the detector array 5 consists of two rows of detector elements 57, there is a great deal of additional room to the top and bottom of detector array 5 to expand the area of unit cell electronics 56.

An increase in area of unit cell electronics 56 allows for significant expansion of the number of memory cells in unit cell electronics 56. This additional area will be utilized in a manner described later herein to enable enhanced performance of the terrain mapping ladar sensor. The detector array 5 of the preferred embodiment is a 2×128 array of detector elements, though the drawing of FIG. 5 shows a 2×16 array of detector elements for purposes of clarity in the presentation. A high voltage detector bias grid 582 is a metallic film deposited on the surface of detector array 5 to distribute the 40-80 VDC typically utilized by the preferred detector structure 65 of the instant invention, an avalanche photodiode. A capacitive voltage distribution grid is formed by evaporating insulating film 581 atop high voltage detector bias grid 582, and then forming grounding mesh 58 on top of insulating film 581. Ground connecting wirebonds 620 are then connected at both ends of the detector array 5 to provide for a low inductance ground reference plane atop detector array 5. Voltage connecting wirebonds 622 are then connected at both ends of detector array 5 to provide for a low inductance voltage plane atop detector array 5. The top surface of detector array 5 in the preferred embodiment is the cathode connection of an array of avalanche photodiode detector elements 57 formed by diffusion into a semiconducting substrate or epitaxial growth of a semiconductor compound onto a semiconducting substrate. The semiconducting substrate of the preferred embodiment is indium phosphide, but may be gallium arsenide, silicon, silicon carbide, gallium nitride, mercury cadmium telluride, or other known semiconductor material suitable to the intended wavelength of operation of the terrain mapping ladar sensor. Different wavelengths may be suitable for many specialized terrain mapping applications, depending on the features being observed, and the nature of any obscuring aerosols or vapors. An indium bump 60 connects the anodes of the detector element of detector array 5 to the inputs of the corresponding unit cell electronic circuit 56 of readout integrated circuit 6. In the preferred embodiment, the detector array 5 and readout integrated circuit 6 are patterned with indium bumps, and the detector array 5 is flipped over and bonded to readout integrated circuit 6 by compression. In an alternative embodiment, a similar process is utilized wherein small solder bumps are applied to both parts, and the detector array 5 is flipped and bonded to readout integrated circuit 6 by means of solder reflow.

At the bottom of FIG. 5 a side view of the detector hybrid is shown mounted to printed circuit substrate 61, which may be alumina, aluminum nitride, glass/epoxy laminate, or other suitable printed material appropriate to the application. In order to feed the high voltage detector bias to the anodes of the detector array 5, a long wirebond 59 is used to connect detector bias voltage pad 66 from the printed circuit substrate up to metal film pad 64 on the detector array 5. The metal film pad 64 is part of the same metal film as the bias grid 582, but shown in profile, and relabeled for clarity. However, long wirebonds are to be avoided in hybrid assembly for a number of reasons. Long wirebonds are not conducive to low inductance bias voltage connections, and are also subject to additional mechanical stress in high vibration environments, which could cause failure in some scenarios. A stair stepped solution is shown making connection to the grounding mesh 58 of detector array 5, with lower wirebond 63 and upper wirebond 62, using the readout integrated circuit 6 as an intermediate height step. In cases where lower speed operations are envisioned, or where absolute minimum cost is desired, the long wirebond 59 or stair stepped solutions 62, 63, may prove adequate. However, a solution where both high speed operations and reliability are facilitated is preferred and is shown in the next figure, FIG. 6.

FIG. 6 shows a top view and front side view of several features designed to overcome the limitations of standard techniques used to implement the hybrid assembly of detector array 5 and readout integrated circuit 6. Metallic leaf spring 67 overlaps the edges of detector bias grid 582 and attaches with solder to metal film pad 64, which is the lateral aspect of a portion of detector bias grid 582. Alternatively, metallic leaf spring 67 may be attached to detector bias grid 582 and metallic film pad 64 with conductive epoxy, or allowed to make electrical contact to detector bias grid 582 through pressure alone. If a pressure contact is the sole method for connecting leaf spring 67 to metallic film pad 64, both must have soft gold plating to ensure a proper electrical connection. Leaf spring 67 has a pair of holes 68 punched or etched at the corners, and a pin 70 soldered thereto. Metallic leaf spring 67 is a thin metal strip in the preferred embodiment, formed in ¾ hard beryllium copper 1/64 inch thick, making possible a very low inductance and high quality electrical connection of the detector bias supply from circuit substrate 73 to detector bias grid 582. Pin 70 penetrates circuit substrate 73 to connect to the high voltage detector bias feed. Pin 70 may also be used in conjunction with a third or fourth metallic leaf spring 671 to make flying ground connections to the top of the substrate comprising detector array 5 where a ground connection is required atop detector array 5 to effect a distributed capacitive voltage grid as detailed in FIG. 5, and later in this application with respect to FIGS. 12-18. Circuit substrate 73 is shaped like a picture frame and is shown in a section view at bottom of FIG. 6. A recess 71 is counter bored in metallic base plate 42 to avoid potential short circuits which might be caused by base plate 42 making contact with pin 70. Base plate 42 may also have thermal enhancements not shown in the figure for the purpose of clarity. Pin 70 may be enhanced by an integral coaxial capacitor 72 with a high voltage rating of typically 100 VDC. In the preferred embodiment, the body of pin 70 is the high voltage conductor, and the pin 70 is surrounded by a highly capacitive dielectric and the capacitor is terminated in a cylindrical outer electrode which is typically connected to circuit ground on circuit substrate 73. This use of integral coaxial capacitor 72 with pin 70 allows for decoupling of high speed voltage transients imposed on the detector bias grid 582 by digital circuits residing on readout integrated circuit 6 or circuit substrate 73, thus improving the performance of detector array 5 through use of the innovative structure. The system of pins 70 and pins with coaxial capacitors 72 together with metallic leaf springs 67 and 671 may be used on all four sides of readout integrated circuit 6 if desired. Metallic leaf springs 67 and 671 may be replaced with a flexible circuit of nickel/gold plated copper on Mylar®, Kapton®, or other polymer film for high volume production. Circuit substrate 73 is of the same or similar thickness as readout integrated circuit 6 to allow for minimal length lateral wirebonds 69 to be made between the bond pads 55 of readout integrated circuit 6 and the bond pads 74 resident on circuit substrate 73. Use of minimal length lateral wirebonds 69 allows for very high speed circuit operation for any signals which must be driven onto the readout integrated circuit 6 from circuit substrate 73 or received by circuit substrate 73 from readout integrated circuit 6.

FIG. 7 shows a top view and front section view taken along line AA of an integrated receive sensor 78 comprised of detector array 5 and readout integrated circuit 6 and several notable features. The detector array 5 and readout integrated circuit 6 comprising integrated receive sensor 78 are formed on the same semiconducting substrate; in the preferred embodiment, indium phosphide. Other substrate materials may be used depending on the wavelength of interest for the terrain mapping ladar sensor. Bond pads 55 at the periphery of the integrated receive sensor 78 provide locations for low inductance lateral wirebonds 69 to connect electrical inputs and outputs from the receive sensor 78 to the bond pads 74 of the supporting circuits residing on circuit substrate 73. Circuit substrate 73 is a picture frame shape in the preferred embodiment, with a rectangular outside geometry and a rectangular cutout centrally located to allow for mounting of the receive sensor 78. Unit cell electrical circuits 56 are disposed laterally to detector elements 57, and may be formed by diffusions 75 into the semiconducting substrate, or by epitaxial regrowth on the surface of the semiconducting substrate of integrated receive sensor 78. Detector elements 57 are formed on the surface of the semiconducting substrate by epitaxial regrowth regions 77 or by diffusions into the semiconducting substrate. In the first preferred embodiment, the highest quality detectors are formed by epitaxial regrowth through rectangular windows opened in a mask after unit cell electrical circuits have been formed by diffusions 75 into the semiconducting substrate. A great number of transistors can be formed within regions 75 by appropriately patterning the substrate, semiconducting n-type or p-type diffusions, and forming oxides, etc., as is well known in the literature. In a second preferred embodiment, where applications dictate the lowest possible cost, detector elements 57 and unit cell electrical circuits 56 may both be formed by diffusion, and epitaxial regrowth of semiconducting films may be foregone, though a lower performing detector array 5 may be the expected result. In a third preferred embodiment, where applications demand the highest performance, all or a portion of unit cell electrical circuits 56 may also be formed by epitaxial regrowth of semiconducting films onto the semiconducting substrate simultaneously with detector elements 57, or by a later, lower temperature profile regrowth. The vertical profile of epitaxial layers needed for detector elements 57 and the transistors of unit cell electrical circuits 56 are different enough in the third preferred embodiment to prohibit formation of both structures simultaneously; therefore a sequential epitaxial regrowth process is necessary to realize both on the same semiconducting substrate. The order of the epitaxial regrowths may be reversed, with detector elements 57 being formed in a first process, and the epitaxial films required for the transistors of unit cell electrical circuits 56 formed subsequently. Several references, including U.S. Pat. No. 4,771,325 issued to Cheng, et al., U.S. Pat. No. 5,189,296 issued to Kwark, U.S. Pat. No. 6,727,530 issued to Feng et al., U.S. Pat. No. 5,063,426 issued to Chandrasekhar et al., and U.S. Pat. No. 6,583,445 issued to Reedy, et al. provide background in this area. The detector bias grid 582 is connected to the cathode of each detector element of the detector array 5 by overlapping metal film portion 76, which contacts at least one side, and preferably all four sides, of each detector element 57 of detector array 5. An insulating layer and ground plane can be added to this structure as well, providing a distributed capacitance voltage distribution grid as in FIGS. 5 and 6, though for clarity in this diagram it is omitted. Also not shown, for the sake of clarity are electrical connections between individual detector elements 57 and the corresponding unit cell electrical circuits 56 of the readout integrated circuit 6, both residing on integrated receive sensor 78.

Typically a semiconducting film of indium gallium arsenide or indium gallium arsenide phosphide is regrown epitaxially to form detector elements 57 or unit cell electrical circuits 56 on integrated receive sensor 78, though in alternative embodiments, gallium arsenide or gallium arsenide phosphide may be formed as one or both of the epitaxial films. Substrate material for the integrated receive sensor may be indium phosphide as in the preferred embodiment, but may alternatively be indium gallium arsenide, or gallium arsenide, depending on the desired operating wavelength of the integrated receive sensor 78. In a fourth preferred embodiment, a silicon substrate is processed normally, with CMOS circuitry having features as fine as 28 nm forming the unit cell electrical circuits 56 and supporting circuitry of the readout integrated circuit 6. Subsequently, a low temperature process is used to epitaxially form the detector elements 57 of detector array 5. The low temperature epitaxial process used may be liquid phase epitaxy (LPE), metal organic chemical vapor deposition (MOCVD), or molecular beam epitaxy (MBE). In the embodiments described herein, detector elements 57 are typically avalanche photodiodes, but may alternatively be PIN diode structures or phototransistors. Both circuit substrate 73 and integrated receive sensor 78 comprised of detector array 5 and readout integrated circuit 6 are attached to base plate 42 using solder or conductive epoxy. Base plate 42 may be thermally enhanced as described previously herein with respect to FIG. 4.

FIG. 8 describes a further embodiment of detector array 5 and illustrates features of the hybrid assembly with readout integrated circuit 6. A top view shows a plan layout of the detector array 5 employing a number of discrete detector die 79, while not showing a number of features of the assembly such as wirebonds, lenses, conductive bumps, and vias, which are evident in the front side view at the bottom of FIG. 8. Bond pads 55 occupy the periphery of readout integrated circuit 6, and provide connection points for the vertical wirebonds 82 used to connect the high voltage detector bias to the top of glass window 80. Glass window 80 has a conductive through hole via 84 which connects detector bias grid 582 to a pad 87 on the top side of glass window 80. An insulating layer and ground plane can be added to this structure as well, providing a distributed capacitance voltage distribution grid as in FIGS. 5 and 6, though for clarity in this diagram it is omitted. Detector elements 57 of detector array 5 are now individual detector die 79, with the cathode of each detector element 57 provided with gold or indium conductive bumps 83. In the preferred embodiment, the detector array 5 is formed by using a pick and place robot to place individual detector die 79 on the inverted glass window 80 (lens face down), and in contact with detector bias grid 582 which has been pre-tinned or screened with solder paste. The glass window 80 with detector die 79 in place is then placed in a solder reflow oven and the solder reflowed to make electrical and mechanical connection of the individual detector die 79 to glass window 80. Alternatively, thermo-compression or thermo-sonic bonding may be used to establish connections between individual detector die 79 and the detector bias grid 582 of glass window 80. Detector bias grid 582 is formed as a thin metallic layer on glass window 80 with microlenses 81 integrally molded on the reverse side of glass window 80 over each detector element 57 site in the detector array 5. Detector array 5 is shown as a microlensed glass window 80 with an array of two rows of individual detector die 79, each row with 5 columns. Once electrical connections have been made to the detector dice 79 cathodes, the glass window 80 and array of detector die 79 may be considered equivalent to detector array 5, though to distinguish this structure, it may be termed a discrete focal plane array (DFPA), and it can be shown to have several advantages in systems with a limited number of pixels. Once the DFPA 5 is formed, it is flipped over and the hybrid assembly is mated to the readout integrated circuit 6 and the solder reflow process is repeated. Glass window 80 is a borosilicate glass in the preferred embodiment, though it may also be a window of calcium fluoride, fused quartz, sapphire, or other semi-transparent material depending on the wavelength of operation and the application. Detector array 5 is a discrete array of 2×128 detector elements 57 in the preferred embodiment, though in this drawing only a 2×5 array is shown for the purpose of clarity. In an alternative embodiment, glass window 80 may be eliminated, and the discrete detector elements 57 picked and placed directly on the readout integrated circuit 6 and affixed by means of conductive epoxy or solder reflow. Detector dice 79 are typically connected with the cathodes attached to the detector bias grid 582, though the opposite connection may be used in some applications, with the detector dice 79 anodes connected to a common detector bias grid 582, and the applied detector voltage bias reversed, without significantly altering the invention or the beneficial effects thereof. The detector elements 57 of DFPA 5 are avalanche photodiodes in the preferred embodiment, but may be PIN, NIP, or other detector structure useful in a desired wavelength and application. One of the major advantages of the DFPA 5 hybrid structure is all of the elements may be pre-tested before being assembled, thus allowing for matching of the response characteristics. Detector elements 57 of the DFPA 5 may be selected for reverse leakage, breakdown voltage, linearity, frequency response, parasitic capacitance, series resistance, quantum efficiency, or any other relevant electronic or optoelectronic parameter desired. Further, since the individual detector elements 57 are fully isolated detector die 79, electrical isolation is vastly increased, thereby greatly reducing electrical crosstalk between detector elements 57 of the detector array 5. Other advantages accrue to the benefit of the DFPA 5 structure which are virtually impossible to reproduce in a single die detector array as described in FIGS. 5-7; the DFPA 5 may be repaired if one detector element 57 of the DFPA 5 is damaged. Further, because the individual detector dice 79 are pretested, arrays with no "bad pixels" are common. In single die detector arrays 5 where all detector elements 57 are formed on the same semiconducting substrate, there is almost always a number of "bad pixels" which are caused by defects in the crystallography of the semiconducting substrate and other processing irregularities. These "bad pixels" are a common affliction for any ladar sensor, and result in a 3-D picture with the appearance of "measles", or "acne". With high performance pick and place machines capable of placing 136,000 components per hour, a 2×128 array may be placed in less than 7 seconds, while a 128×128 array typical of larger format flash ladar sensors can be placed in 6.5 minutes. One drawback to the DFPA is the minimum size of any detector die 79 is in the range of 250 microns, since the detector die 79 must be picked up by a vacuum chuck and positioned mechanically, whereas single die detector arrays 5 may be fabricated with a pitch of 50 microns or less. Therefore, for a single die detector array 5 of a given complexity, the same DFPA 5 would result in a much larger square area, requiring concomitantly larger optical apertures. If very high resolution arrays, larger than 256×256 square are required, the option of a DFPA 5 becomes problematic, and the resulting size may be hard to accommodate. The DFPA therefore has maximum advantage in lower complexity, high performance arrays, and can provide significant cost savings in applications requiring zero defects or well matched optoelectronic performance, owing to higher yields over single die detector arrays 5.

FIG. 9 shows the preferred structure for assembling a DFPA 5 and readout integrated circuit 6 into the hybrid package of FIG. 4. The subassembly of DFPA 5 and readout integrated circuit 6 is placed on base plate 42 of the hybrid package and is attached using solder or conductive epoxy. Circuit substrate 73 has been previously attached to base plate 42 and receives lateral bond wires 69 on bond pads 74. Lateral bond wires 69 terminate on bond pads 55 at the periphery of readout integrated circuit 6. Basic pins 70 or coaxial capacitor pins 72 are soldered to circuit substrate 73, and leaf spring 67 is soldered thereto. Leaf spring 67 is then connected to pad 87 atop glass window 80 with solder or conductive epoxy. Pad 87 is connected to the detector bias grid 582 through glass window 80 by conductive through hole vias 84. Except for the different height and appearance of DFPA 5, the hybrid assembly of DFPA 5 and readout integrated circuit 6 proceeds in a like manner to the assembly of a single die detector array 5.

FIG. 10 is a block diagram of the unit cell electronics 56 associated with each detector element 57 of detector array 5. The input of input amplifier 88 of each unit cell electronics 56 is connected to an anode of a detector element 57 of detector array 5. The output of input amplifier 88 connects to the input of a trigger circuit 89 and to a number of sampling circuits 93. Each sampling circuit 93 behaves as an analog switch connected to a storage capacitor represented in FIG. 10 as memory cell 94. When activated by a select signal from circular selector 92, sampling circuit 93 closes an internal analog switch for a short period of time, typically less than a nanosecond, charging the internal storage capacitor of memory cell 94, and then reopens the internal analog switch, saving a sample of the input amplifier 88 output voltage. The number of sampling circuits 93 matches the number of memory cells 94. Only three memory circuits 94 are shown in FIG. 10 for the purpose of clarity, although there are many more in the preferred embodiment, in a typical configuration 20 to 44. The sampling is accomplished by the clock 96, circular selector 92 and sampling circuits 93. Clock 96 resides outside the unit cell electronics 56, on the common portion of readout integrated circuit 6. The circular selector 92 has as many outputs as there are memory cells 94. At each pulse of clock 96, the circular selector 92 shifts, turning on a separate and independent sampling circuit 93 which connects the input amplifier 88 output to one memory cell 94. After all memory cells 94 have been filled, the memory cells 94 are overwritten as new data arrives. Consequently, the memory cells 94 are always filled with the most recently sampled waveform data. The period of clock 96 is typically much shorter than the pulse width of the reflected laser illuminating pulse, and so the reflected pulse shape is captured in the memory cells 94. If the input amplifier 88 is a transimpedance amplifier the detector 57 current is transformed to a voltage and the memory cells 94 sample this voltage. If the input amplifier 88 is a current amplifier the detector element 57 current is amplified and the memory cells 94 integrate this current. The circular selector 92 is a simple sequential shift register in the preferred embodiment, but could be based upon an algorithm and therefore may not be sequential. Also connected to the output of input amplifier 88 is a trigger circuit 89 which is a Schmitt trigger in the preferred embodiment with an internal reference voltage level set globally by the common portion of readout integrated circuit 6 to detect the presence of a reflected laser transmit pulse in the output of input amplifier 88. A delay circuit 90 allows for data to continue to be accumulated in the memory cells 94 even in the case of a strong input signal or transient, so a complete picture of the reflected light pulse may be captured. When the output of the trigger circuit 89 transitions, the circular selector 92 is frozen after the delay time programmed into delay circuit 90, again allowing for sufficient time to accumulate an entire waveform of a reflected and detected laser illuminating pulse. Counter 91 accumulates the number of clock cycles fed to circular selector 92 before trigger circuit 89 transitions and freezes the circular selector 92, terminating the data acquisition period and freezing the contents of memory cells 94. Counter 91 is a 12 bit binary counter in the preferred embodiment, but may be more, or may be as few as 8 bits or less depending on the application. The output of the counter 91 is directly proportional to the two way time of flight of a transmitted and reflected laser illuminating pulse. The two way time of flight of a laser illuminating pulse sent from pulsed laser transmitter 2 to a reflective object in a scene in the field of view of the terrain mapping ladar sensor, and returned therefrom, is directly proportional to twice the range to the same reflective object. Both the counter output 91 and the memory cell 94 contents may be read out by readout integrated circuit 6 during the time between laser illuminating pulses. Output control 97 is a section of readout integrated circuit 6, which selects the memory cells 94 in sequence during a readout cycle of readout integrated circuit 6. Output amplifier 95 buffers the output of the selected memory cells 94 of each unit cell electrical circuit 56. Laser illuminating pulses typically occur 10-30 times per second, though faster or slower rates are also anticipated and provided for by the preferred embodiments described herein. The terrain mapping ladar sensor may be operated in a range gated mode, in which samples of the reflected laser light signals are analyzed by an external digital processor. In the range gated mode, large signal reflections in the near field may be ignored, or "range gated" out of the target space and objects in the targeted range space may be detected with greater sensitivity. In this way, referring back to FIG. 2, a glint, or glare from the surface of water 29 could be the returned signal with the greatest strength, but it might be range gated out, and thus the terrain mapping ladar sensor may develop a greater sensitivity to oscillating mine 34A In previous publications of the present inventors, this range gated mode is referred to as SULAR mode. In FIGS. 5-9 it has been shown there is a great deal of additional area adjacent to the individual detector elements 57, owing to the nature of the organization of the detector array as a 2 row detector array 5. This particular geometric arrangement is conducive to a major expansion of the unit cell electronics 56, creating the opportunity to have several hundred up to perhaps a thousand memory cells 94, allowing for very long ranges to be accommodated by the terrain mapping ladar sensor of the instant invention. These described advantages may also be realized by reducing the feature sizes of the unit cell electronic circuits 56 photolithographically in the alternative where a square or rectangular detector array 5 of more than 2 rows and columns is required. In such an alternative embodiment, circuit features are reduced photolithograpically, and the readout integrated circuit 6 and detector array 5 are fabricated as a 128×128 array or larger M×N array of detector elements 57 and unit cells 56.

FIG. 11 shows an alternative embodiment of the hybrid package of FIG. 4 which may have some advantages in certain lower speed applications. The package is known in the industry as a low temperature co-fired ceramic (LTCC) package. Features have been added to the typical LTCC package which adapt the package specifically to the needs of the detector array 5 and readout integrated circuit 6 hybrid assembly. A glass window 48 is fuzed to ceramic cover 98. A Ceramic base 100 contains a circuit zone 101 made up of alternating layers of conductive traces and insulating ceramic in a manner similar to common thick film ceramic circuit substrates. An optional recess 102 in the ceramic base 100 allows for minimum length lateral wirebonds 69 to be utilized. The conductive traces of circuit zone 101 connect to the bond pads 55 at the periphery of readout integrated circuit 6 through lateral wirebonds 69 as described previously herein. A rectangular array of gold plated beryllium copper pins 103 is attached to the external aspect of the conductive traces embedded in circuit zone 101 by soldering or brazing. In a second alternative embodiment, the array of beryllium copper pins 103 is replaced by metallic bumps for high volume automated assembly. A typical assembly sequence begins with a die attach operation of the detector array 5 and readout integrated circuit 6 hybrid sub-assembly to ceramic base 100 which will already have an array of pins 103 or metallic bumps in place. Next, lateral wirebonds 69 are made from readout integrated circuit 6 to the conductive traces of circuit zone 101. Vertical or angled wirebonds may be used in a basic configuration where no recess 102 is formed in ceramic base 100. Finally, in a vacuum or in an inert gas environment, a low temperature glass frit powder or slurry is applied at hermetic joint 99 and the package sealed under temperature and pressure.

FIG. 12 is a schematic diagram of a preferred circuit configuration which will enable the terrain mapping ladar sensor by increasing the sensitivity of the detector circuit associated with each detector element 57 of the detector array 5. Increased sensitivity is achieved through a reduction of noise coupled in to the detector element 57 through the bias feed, reducing the effects of random noise as well as reducing self interference sourced from adjacent pixels and coupled through the power supply. Shown in FIG. 12 is a PIN photodiode comprising detector element 57 of a preferred embodiment, though NIP, PN, and APD detector structures may be employed as detector element 57 in a series of alternative embodiments using the circuit of FIG. 12. Isolation to fluctuations and noise in the VBIAS voltage is achieved through use of series limiting resistor RBIAS 105 and decoupling capacitor CBIAS 104 connected in parallel to circuit ground. Each unit cell 56 of the readout integrated circuit 6 is comprised of an input transimpedance amplifier 88 and a feedback resistance RFB. RBIAS may be of a nominal value of 20 k ohms and may be sized to fuse at a given current level of 2 milliamperes or less, indicative of a short circuit in the detector element 57 or unit cell electrical circuit 56. Designing RBIAS to fuse at a chosen level allows the terrain mapping ladar sensor system to avoid possible damage to the remaining operational circuits of readout integrated circuit 6 and detector array 5 in the case of a single pixel failure. CBIAS 104 is typically 500 femtofarads due mainly to the geometry of the conductive and insulative structures used to implement the desired capacitance CBIAS 104. The parasitic capacitance CPIN of the 70 micron diameter PIN structure is typically less than 50 femtofarads, meaning the nominal value of 500 femtofarads for CBIAS is quite significant in relative terms. Two structures are detailed in FIGS. 13 and 14 which implement all or a portion of the circuit of FIG. 12.

FIG. 13 is a diagram of a focal plane array (FPA) comprised of a number of mesa PIN array structures which incorporates a capacitive detector bias grid but not the series limiting resistor RBIAS 105. Shown in FIG. 13 for the sake of clarity is a simplified series of three mesa type PIN structures, though the typical array of the preferred embodiment is a 2×128 array of PIN detector elements 57. A semiconducting substrate 106 is typically made of a single crystal of indium phosphide, indium gallium arsenide, or indium gallium arsenide phosphide, though other materials are anticipated and may be substituted depending on the wavelength of light to be received. An array of microlenses 107 is formed on the reverse side of substrate 106 to concentrate the incoming light and reduce optical losses due to a less than unity fill factor due to the area given up to the conductors 108 and 110 between detector elements 57 of detector array 5. Each microlens 107 is situated over the center of an individual detector element 57 of detector array 5 and may be formed by etching of the substrate material 106 or may be molded over the substrate 106. If microlens array 107 is overmolded, a glass with a matching coefficient of thermal expansion is selected, or a polymer may be used. Polymer materials used for microlens array 107 should also have a matching coefficient of thermal expansion, though the polymer will typically show greater tolerance to lateral stress in heating and cooling cycles. Between each mesa structure, voltage plane metallic film 108 acts to distribute the detector bias voltage directly to the cathode of each APD detector element 57 of detector array 5. Each PIN detector element 57 of the detector array 5 in the preferred embodiment has a square aspect when viewed from the top, so a mesh pattern is made by voltage plane metallic film 108 when viewed from above. The mesh pattern of voltage plane metallic film 108 is similar to the ground plane grid 120 of FIG. 15 for reference. An insulating layer 109 of silicon nitride, glass, or other suitable material is then formed atop voltage plane metallic film 108, again forming a mesh or screen pattern when viewed from above. Finally, a ground plane metallic film 110 is formed atop insulating layer 109 in a mesh pattern with setbacks from the edge of insulating layer 109 as shown. Once the ground plane metallic film 110 and voltage plane metallic film 108 are connected externally via wirebonds or leaf springs, a distributed capacitance is formed by the overlapping metallic film mesh patterns 108 and 110 separated by a thin dielectric layer 109, which improves the performance and isolation of the individual PIN detector elements 57 of detector array 5. Metallic films 108 and 110 and insulating film 109 may be formed by physical vapor deposition or sputtering, or by any other suitable process, including electroplating. Metallic film 108 is typically a sequence of titanium for adhesion to the semiconductor substrate 106, followed by a nickel barrier and then gold in selected areas where external electrical connections are to be made. Likewise, metallic film 110 may be titanium or other suitable base metal, followed with nickel and then gold in areas selected for external electrical connection. The individual detector elements 57 are typically a PIN photodiode mesa structure as shown in FIG. 13, with a cathode 111 formed of highly doped n-type indium phosphide. The anode 115 of the APD detector element 57 shown in FIG. 13 is of highly doped p-type indium phosphide. An epitaxial layer of intrinsic (π-type) indium phosphide 114 completes the structure of the PIN detector element 57 of detector array 5. The mesa structures are formed in a preferred embodiment on a substrate 106 of n+ type indium phosphide, indium gallium arsenide, or indium gallium arsenide phosphide, which has been augmented by additional epitaxial growths of a cathode contact region 111 of n+ indium phosphide, an intrinsic region 114 of π-type indium phosphide, and an anode contact region 115 of p+ type indium phosphide. Once all of the epitaxial layers 111, 114, and 115 have been grown, the mesas are formed by dry etching in areas not covered by a photoresist etch stopping mask. Finally, an ohmic anode contact 116 is formed by selectively evaporating a metallic film atop each mesa, typically titanium/platinum/gold or titanium/nickel/gold. The proximity of voltage plane metallic film 108 to n+ InP region 111 means an effective cathode connection of each APD detector element 57 is formed as a common connection through the highly conductive semiconductor substrate 106. The number of individual detectors 57 shown in FIG. 13 is limited to a line of 3, part of a 3×3 detector array 5, for the purpose of clarity. The nominal detector array 5 in the preferred embodiment is an array of 2×128 individual detectors 57, and the technology described is anticipated to be used on M×N detector arrays 5 of 128×128 and larger.

FIG. 14 is side view diagram of a more advanced type of focal plane array which may offer even greater sensitivity to weak reflected light signals returning from distant targets. The hybrid structure is formed from two pieces, the first one a glass substrate 117 with molded lenses 118 centered over each site of a detector element 57 of the detector array 5. Atop the glass substrate 117 are a ground plane metallic film 120, a silicon nitride insulating layer 121, a number of capacitive cathode ring contacts 124, an equal number of tantalum nitride film resistors 123, and a voltage plane metallic film 122. The metallic films 120, 122, and 124 are applied via physical vapor deposition, sputtering, electroplating, or other suitable process. The insulating layer 121 and resistive film layer 123 are applied via physical vapor deposition in the preferred embodiment, though sputtering may also be used. The insulating layer 121 may be silicon nitride, silicon dioxide, or other suitable material. The resistive film 123 may be tantalum nitride, nickel chromium, chromium silicon oxide, or other suitable material. The structure of the cathode ring contacts 124 overlayed atop insulating layer 121 and ground plane metallic film 120 form a high quality distributed capacitor CBIAS 104 which decouples the bias voltage directly at the PIN cathode as shown in the schematic of FIG. 12. The value of CBIAS may be as high as 500 femtofarads, depending on the geometry of the cathode ring contact 124, and the thickness and dielectric constant of the insulating layer 121. Higher values of CBIAS 104 may be realized by reducing the thickness of insulating layer 121, or by increasing the area of cathode ring contact 124, or by adding additional ground plane metallic film 120 in selected areas. The artwork for each layer 120-124 is shown in the succeeding FIGS. 15-18. The second piece of the hybrid structure is a PIN focal plane array formed on a solid substrate of n+ indium phosphide material, comprising a trapezoidally shaped PIN mesa structure 126 with layers 111, 114, and 115 grown epitaxially as described in the discussion of FIG. 13. A metallic film anode contact 127 is then evaporated or sputtered atop the anode semiconductor material 115 as shown in the diagram. The metallic film anode contact 127 may be selectively gold plated or covered with a photoresist to act as an etch stop. Prior to etching back the anode face of the semiconductor substrate to form the mesa structures, the n+ indium phosphide wafer substrate (106 in FIG. 13) is thinned to 125 microns in the preferred embodiment, though thinning to less than 125 microns is anticipated and may produce additional benefits. Once the substrate has been thinned, metallic ohmic cathode contacts 125 are formed on the cathode side of each detector element 57 of detector array 5 in a square ring shape. An anti-reflection coating 119 is evaporated onto the cathode face of each detector element 57 of detector array 5 as well. The thinned semiconductor substrate (106 in FIG. 13) is then attached to the glass substrate 117 by soldering, thermosonic bonding, or thermocompression bonding at the interface between ohmic cathode contacts 125 and capacitive cathode ring contacts 124. Finally, the mesas are etched completely through, fully isolating the mesa structures 126 from each other. Typically, this etching process selectively removes the epitaxial layers 111, 114, and 115 plus the remaining thickness of substrate 106 which has not been removed by any previous wafer thinning operation, in areas between the individual detector elements 57 of detector array 5. This process fully implements the schematic of FIG. 12, providing isolation between detector elements, filtering of the external power supply, localized decoupling of the detector voltage supply, and fuse protection of each detector element 57 of detector array 5. The bias feed network described in connection with FIGS. 12 and 14 comprised of a series connected fusible resistance RBIAS 105 (123) and a parallel connected decoupling capacitance CBIAS 104 (124) may also be applied to any variant of the discrete focal plane array (DFPA) described in association with FIGS. 8 and 9. FIGS. 13 and 14 show innovative structures of the detector array 5, but do not show assembly of the detector array 5 with readout integrated circuit 6 for the purpose of clarity. The hybrid assembly of these unique detector array 5 structures with the readout integrated circuit 6 may be completed in the normal manner, by soldering or compression of indium bumps.

An alternative process to realize the embodiment of the structure of FIG. 14 starts with a thick semiconductor substrate (106 in FIG. 13), typically in the range of 300-400 microns. Cathode contacts 125 and anti-reflection coating 119 are then formed on substrate 106 prior to attachment to the glass substrate 117 by means of thermocompression bonding, solder, or conductive epoxy. The substrate is then thinned to as few as 75 microns, and epitaxial layers 111, 114, and 115 are then grown. The anode contacts 127 are then formed and mesas etched either partially or fully through the remaining thickness. This process results in reduced time to thin the substrate 106. It also results in a potentially thinner wafer, as it is already bonded to glass substrate 117 in final position. However, it is often not desirable to import solder, epoxy, or certain other bonding materials into the MOCVD (metal Organic Chemical Vapor Deposition) chambers often used to grow epitaxial films 111-115, so the alternative process of this paragraph may not be the best option for some wafer processors. The process described in the previous paragraph above typically involves another attachment process to a lapping and polishing puck. The resultant de-attach and handling processes require a certain strength in the wafer which means the thinning operation must leave the wafer somewhat thicker (125 microns) than in the alternate process described in this paragraph (75 microns). Either process sequence produces a similar structure. Additionally, the order of epitaxial layers 111, 114, and 115 may be reversed, resulting in an anode-up (towards lens 118) structure versus the cathode-up structure of FIG. 14. The polarity of the bias voltage supplied by the voltage plane metallic film 122 would then also need to be reversed, with the result being the anode-up structure having the same or similar performance advantages of the cathode-up structure depicted in FIGS. 13 and 14.

FIG. 15 shows the artwork for a ground plane metallic film 120 which acts as a distribution grid for a circuit ground connection in the schematic of FIG. 12 and the advanced PIN detector array 5 of FIG. 14. FIG. 16 shows the artwork for the silicon nitride insulating layer 121 overlayed on the same ground plane metallic film 120 of the preferred embodiment described in the associated text and diagram of FIG. 14. FIG. 17 shows the artwork for the capacitive cathode ring contacts 124 overlayed on the silicon nitride insulating layer 121 and the ground plane metallic film 120 of the preferred embodiment described in the associated text and diagram of FIG. 14. FIG. 18 shows a top view of the completed assembly of FIG. 14, including a view of the art work for the voltage plane metallic film 122 overlayed on the insulating layer 121, an outer portion of the capacitive cathode ring contacts 124, and the ground plane metallic film 120. Also shown is a top view of the metallic film anode contact 127 and the tapering aspect of the trapezoidal PIN mesa structure 126. The resistor RBIAS of FIG. 12 is provided for by resistive film segment 123, shown in 9 places on FIG. 18. The number of individual detectors 57 shown in FIG. 18 is limited to a 3×3 detector array 5, for the purpose of clarity. The nominal detector array 5 in the preferred embodiment is 2×128, and the technology described is anticipated to be used on M×N detector arrays 5 of 128×128 and larger.

Although the invention of the Terrain Mapping LADAR Sensor and associated circuits and systems have been specified in terms of preferred and alternative embodiments, it is intended the invention shall be described by the following claims and their equivalents.

The invention claimed is:

1. A terrain mapping ladar system with a field of view and a wavelength of operation comprising:
   a ladar sensor mounted to a ladar platform, said ladar sensor mounted within a radome which is attached to said ladar platform, said radome with at least one transparent surface capable of transmitting light at said wavelength of operation,
   wherein said ladar sensor includes:
   a pulsed laser light output and diffusing optic for illuminating a scene in the field of view of said ladar sensor;
   a time zero reference electrical output indicating a start time of pulsed laser light produced by the pulsed laser light output;
   a lens assembly which collects light pulse signals reflected from said scene in the field of view and directs said collected light pulse signals onto a focal plane array;
   said focal plane array comprising a two dimensional array of light sensitive detectors positioned in a focal plane of the lens assembly, each light sensitive detector having an output adapted to produce an electrical pulse from a reflected portion of the pulsed laser light output;
   a detector bias circuit connected to at least one voltage distribution grid of said focal plane array;
   a readout integrated circuit comprising a plurality of unit cell electrical circuits, and said focal plane array electrically and mechanically connected to the readout integrated circuit;
   and wherein each unit cell electrical circuit has an input amplifier electrically connected to an output of a light sensitive detector of said focal plane array, said unit cell electrical circuit adapted to amplify said electrical pulse and having a trigger circuit adapted to detect the presence of said electrical pulse and thereupon to produce an acquisition termination signal, wherein each unit cell electrical circuit further includes a unit cell timing circuit initiated by said time zero reference electrical output, said unit cell timing circuit being terminated by said acquisition termination signal, thereby measuring the time of flight of a reflected light pulse to the unit cell, said unit cell timing circuit having a unit cell time of flight output connected to an output of a readout circuit, and the readout circuit having a 3D image output comprising a plurality of the unit cell time of flight outputs, said amplifier further having an output connected to a number of sampling gates, and each sampling gate having an output connected to a storage capacitor, and each sampling gate having a control input adapted to drive the sampling gate from a high impedance state to a low impedance state, and a logic circuit having clock input and a digital counter, and having a plurality of logic outputs, and each sampling gate control input connected to a logic output, the digital counter initiated by the time zero reference electrical output, and the digital counter being terminated by an acquisition termination signal, thereby creating a plurality of analog samples of the amplifier output over a period of time, the analog samples being stored on the storage capacitors, and thereby creating a time history of analog samples of a light pulse signal reflected from the scene in the field of view said storage capacitors connected to an output circuit when selected by an output control of the readout circuit.

2. The terrain mapping ladar system of claim 1 wherein said ladar platform is an unmanned aerial vehicle.

3. The terrain mapping ladar system of claim 1 wherein the pulsed laser light output is coupled to a light sensitive detector of said focal plane array through an optical pickoff and fiber optic waveguide.

4. The terrain mapping ladar system of claim 1 wherein said radome is substantially transparent to wavelengths of light in the range of 1-2 micrometers.

5. The terrain mapping ladar system of claim 1 wherein said laser light output is from a solid state laser.

6. The terrain mapping ladar system of claim 5 wherein said solid state laser is made of erbium doped phosphate glass.

7. The terrain mapping ladar system of claim 5 wherein said solid state laser is in the shape of a disc.

8. The terrain mapping ladar system of claim 1 wherein said laser light output is from an array of vertical cavity surface emitting lasers.

9. The terrain mapping ladar system of claim 1 wherein the source of said laser light output is mounted to a motorized pivot.

10. The terrain mapping ladar system of claim 1 further comprising a positional reference.

11. The terrain mapping ladar system of claim 10 wherein said positional reference comprises a Global Positioning System receiver.

12. The terrain mapping ladar system of claim 10 wherein said positional reference further comprises at least one antenna for receiving radio signals.

13. The terrain mapping ladar system of claim 1 further comprising a pressure sensor.

14. The terrain mapping ladar system of claim 1 wherein said ladar platform is a submersible vehicle.

15. The terrain mapping ladar system of claim 14 wherein said radome attached to said ladar platform is substantially transparent to wavelengths of light between 400-550 nanometers.

16. The terrain mapping ladar system of claim 1 further comprising an image processor which compensates measured range data for motion of said ladar platform.

17. The terrain mapping ladar system of claim 1 wherein said focal plane array comprises an array of light sensitive detectors selected from the set of a PIN diode and an avalanche photodiode.

18. The terrain mapping ladar system of claim 1 wherein said reference signal indicating the start time of said pulsed laser light output is derived from an optical sample of the pulsed laser light output.

19. The terrain mapping ladar system of claim 1 wherein said two dimensional array of light sensitive detectors is packaged in a hermetic package.

20. The terrain mapping ladar system of claim 19 wherein said substantially hermetic package is a quad flatpack.

21. The terrain mapping ladar system of claim 1 wherein the focal plane array is flip chip bonded to the readout integrated circuit as a hybid construction.

22. The terrain mapping ladar system of claim 1 wherein said two dimensional array of light sensitive detectors is a discrete focal plane array.

23. The terrain mapping ladar system of claim 1 wherein said focal plane array is a discrete focal plane array of individual detector elements bonded to a transparent substrate.

24. The terrain mapping ladar system of claim 1 wherein focal plane array is a discrete focal plane array of individual detector elements bonded to the readout integrated circuit.

25. The terrain mapping ladar system of claim 1 wherein said focal plane array is formed on a single semiconducting substrate, said single semiconducting substrate having a detector bias voltage distribution grid with a distributed capacitance.

26. The terrain mapping ladar system of claim 25 wherein said detector bias voltage distribution grid with a distributed capacitance includes a ground plane metallic film overlapping a voltage plane metallic film, and said ground plane metallic film is separated from said voltage plane metallic film by an insulating layer.

27. The terrain mapping ladar system of claim 1 wherein said focal plane array is formed on a single semiconducting substrate, said single semiconducting substrate affixed to a transparent substrate and selectively etched between detector elements thereby electrically isolating the elements of said focal plane array.

28. The terrain mapping ladar system of claim 27 wherein said transparent substrate further includes a metallic film bias voltage distribution grid overlapping a metallic film ground distribution grid, and said metallic film bias voltage distribution grid separated from said metallic film ground distribution grid by an insulating layer.

29. The terrain mapping ladar system of claim 28 wherein said transparent substrate further includes a plurality of thin film resistors, each of said thin film resistors connected in series between said voltage distribution grid and a terminal of an individual element of said two dimensional array of light sensitive detectors, a resistor-capacitor "L" filter network formed by the thin film resistors and capacitance of the voltage distribution grid.

30. The terrain mapping ladar system of claim 1 wherein said two dimensional array of light sensitive detectors is mounted to a linear translation stage.

* * * * *